(12) United States Patent
Hazama

(10) Patent No.: US 8,098,509 B2
(45) Date of Patent: Jan. 17, 2012

(54) NONVOLATILE SEMICONDUCTOR MEMORY DEVICE, METHOD OF FABRICATING THE NONVOLATILE SEMICONDUCTOR MEMORY DEVICE AND PROCESS OF WRITING DATA ON THE NONVOLATILE SEMICONDUCTOR MEMORY DEVICE

(75) Inventor: Hiroaki Hazama, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 286 days.

(21) Appl. No.: 12/562,479

(22) Filed: Sep. 18, 2009

(65) Prior Publication Data

US 2010/0265767 A1    Oct. 21, 2010

(30) Foreign Application Priority Data

Apr. 21, 2009   (JP) .................. 2009-103083

(51) Int. Cl.
   *G11C 5/06*   (2006.01)
(52) U.S. Cl. .............. 365/63; 257/316; 365/185.17; 365/189.2
(58) Field of Classification Search .......... 257/316; 365/63, 185.17, 189.2
   See application file for complete search history.

(56) References Cited

U.S. PATENT DOCUMENTS

| | | | | |
|---|---|---|---|---|
| 4,977,542 A | * | 12/1990 | Matsuda et al. | ............ 365/207 |
| 5,966,326 A | | 10/1999 | Park et al. | |
| 6,674,138 B1 | * | 1/2004 | Halliyal et al. | ............... 257/411 |
| 6,845,042 B2 | * | 1/2005 | Ichige et al. | ............. 365/185.17 |
| 6,925,008 B2 | * | 8/2005 | Ichige et al. | ............. 365/185.17 |
| 7,539,055 B2 | * | 5/2009 | Enda et al. | ............. 365/185.18 |
| 7,649,777 B2 | * | 1/2010 | Ichige et al. | ............. 365/185.17 |

FOREIGN PATENT DOCUMENTS

| | | |
|---|---|---|
| JP | 10-106279 | 4/1998 |
| JP | 2000-269470 | 9/2000 |

OTHER PUBLICATIONS

U.S. Appl. No. 12/792,378, filed Jun. 2, 2010, Okamura, et al.

* cited by examiner

*Primary Examiner* — Alexander Sofocleous
(74) *Attorney, Agent, or Firm* — Oblon, Spivak, McClelland, Maier & Neustadt, L.L.P.

(57) ABSTRACT

A nonvolatile semiconductor memory device includes a semiconductor substrate, a plurality of first element isolation insulating films formed on a surface of the semiconductor substrate corresponding to a first cell array region into a band shape, a plurality of second element isolation insulating films formed on a surface of the semiconductor substrate corresponding to a second cell array region into a band shape. Each first element isolation insulating film has a level from a surface of the semiconductor substrate, the first charge storage layer has a level from the surface of the semiconductor substrate, and each second element isolation insulating film has a level from the surface of the semiconductor substrate, the level of each first element isolation insulating film being lower than the level of the first charge storage layer and higher than the level of each second element isolation insulating film.

10 Claims, 18 Drawing Sheets

NONVOLATILE SEMICONDUCTOR MEMORY DEVICE, METHOD OF FABRICATING THE NONVOLATILE SEMICONDUCTOR MEMORY DEVICE AND PROCESS OF WRITING DATA ON THE NONVOLATILE SEMICONDUCTOR MEMORY DEVICE

CROSS-REFERENCE TO RELATED APPLICATIONS

This application is based on and claims the benefit of priority from the prior Japanese Patent Application No. 2009-103083, filed on Apr. 21, 2009, the entire contents of which are incorporated herein by reference.

BACKGROUND

1. Field

The present invention relates to a nonvolatile semiconductor memory device two types of memory areas provided in a single memory chip, a method of fabricating the nonvolatile semiconductor memory device, and a process of writing data of the nonvolatile semiconductor memory device.

2. Related Art

Various types of nonvolatile semiconductor memory devices have been developed according to various types of intended purposes or usages. For example, Japanese patent application publication JP-A-H10-106279 discloses a configuration that two types of memory areas are provided on a single memory chip. One of the memory areas is a binary memory area (SLC: single level cell) which is suitable for high-speed write and readout and the other is a multilevel memory area (MLC: multi level cell) which has an improved amount of data stored per memory cell.

The above-described nonvolatile semiconductor memory device includes a cell array region for a single bit operation mode, a cell array region for a multi bit operation mode, a page buffer circuit for the single bit operation mode and a page buffer circuit for the multibit operation mode all of which are provided on a single substrate. As a result, both or one of a multi-bit operation and a single-bit operation is executable simultaneously or selectively.

Thus, a using manner of each cell array region of the memory cell array is changed according to various purposes of the nonvolatile semiconductor memory device. However, when a memory cell device structure in each cell array region in the memory cell array is uniformed, there results in a case unsuitable for use of each cell array region.

SUMMARY

According to one aspect of the present invention, there is provided a nonvolatile semiconductor memory device comprising a semiconductor substrate having a first cell array region in which a first memory cell transistor is disposed and a second cell array region in which a second memory cell transistor is disposed; a plurality of first element isolation insulating films formed on a surface of the semiconductor substrate corresponding to the first cell array region into a band shape; a plurality of second element isolation insulating films formed on a surface of the semiconductor substrate corresponding to the second cell array region into a band shape; a first gate electrode for the first memory cell transistor formed by dividing the semiconductor substrate corresponding to the first cell array region by the first element isolation insulating film, the first gate electrode having a first gate insulating film formed on a first active region divided by the first element isolation insulating film, a first charge storage layer formed on the first gate insulation film, a first interelectrode insulating film formed on the first charge storage layer and a first control electrode formed on the first interelectrode insulating film; and a second gate electrode for the second memory cell transistor formed by dividing the semiconductor substrate corresponding to the second cell array region by the second isolation insulating film, the second gate electrode having a second gate insulating film formed on a second active region divided by the second element isolation insulating film, a second charge storage layer formed on the second gate insulation film, a second interelectrode insulating film formed on the second charge storage layer and a second control electrode formed on the second interelectrode insulating film, wherein each first element isolation insulating film has a level from a surface of the semiconductor substrate, the first charge storage layer has a level from the surface of the semiconductor substrate, and each second element isolation insulating film has a level from the surface of the semiconductor substrate, the level of each first element isolation insulating film being lower than the level of the first charge storage layer and higher than the level of each second element isolation insulating film.

According to another aspect of the present invention, there is provided a method of fabricating a nonvolatile semiconductor memory device, comprising forming a gate insulating film on portions of a semiconductor substrate corresponding to first and second cell array regions respectively; forming a charge storage layer on the gate insulating film of the first and second cell array regions; forming a plurality of element isolation trenches so as to extend through the charge storage layer and the gate insulating film and into the semiconductor substrate; forming an element isolation insulating film in the element isolation trenches of each of the first and second cell array regions; etching an upper part of the element isolation insulating film so that the element isolation insulating film in the first cell array region has an upper surface located higher than an upper surface of the element isolation insulating film in the second cell array region; forming an interelectrode insulating film on the charge storage layer and the element isolation insulating film; and forming a control electrode on the interelectrode insulating film.

According to further another aspect of the invention, there is provided a process of writing data on a nonvolatile semiconductor memory device, the nonvolatile semiconductor memory device including a first cell array region in which a first memory cell transistor is disposed on a semiconductor substrate and a second cell array region in which a second memory cell transistor is disposed on the semiconductor substrate; a plurality of first element isolation insulating films formed in a surface of the semiconductor substrate in the first cell array region, so as each to have a band shape; a plurality of second element isolation insulating films formed in a surface of the semiconductor substrate in the second cell array region, so as each to have a band shape; a first gate electrode of the first memory cell transistor divided by the first element isolation insulating film on the semiconductor substrate in the first cell array region, the first gate electrode having a first gate insulating film formed on a first active region divided by the first element isolation insulating film, a first charge storage layer formed on the first gate insulating film, a first interelectrode insulating film formed on the first charge storage layer and a first control electrode formed in the first interelectrode insulating film; a second gate electrode of the second memory cell transistor divided by the second element isolation insulating film on the semiconductor substrate in the second cell array region, the second gate electrode having a second gate insulating film formed on a second active region divided by the first element isolation insulating film, a second charge storage layer formed on the second gate insulating film, a second charge storage layer formed on the second gate insulating film, a second interelectrode insulating film formed on the second charge storage layer and a second control electrode formed in the second interelectrode insulating film, the nonvolatile semiconductor memory device, wherein each first element isolation insulating film has a level from a surface of the semiconductor substrate, the first charge storage layer has a level from the surface of the semiconductor substrate, and each second element isolation insulating film has a level from the surface of the semiconductor substrate, the height of each second element isolation insulating film being lower than the level of the second charge storage layer and higher than the level of each second element isolation insulating film; and the first cell array region is configured into a temporary storage area, and the second cell array region is configured into a long-term storage area, the nonvolatile semiconductor memory device further including a control section executing a process of writing data onto the first and second memory cell transistors, wherein the control section further executes a process of writing data for every bit of the multilevel data to be written onto different first memory cell transistors of the first memory cell region, a process of reading the multilevel data for every bit from the first memory cell transistor of the first memory cell region and writing the read data for every bit onto the same second memory cell transistor of the second memory cell region with respect to every bit.

DETAILED DESCRIPTION

Figure 1:
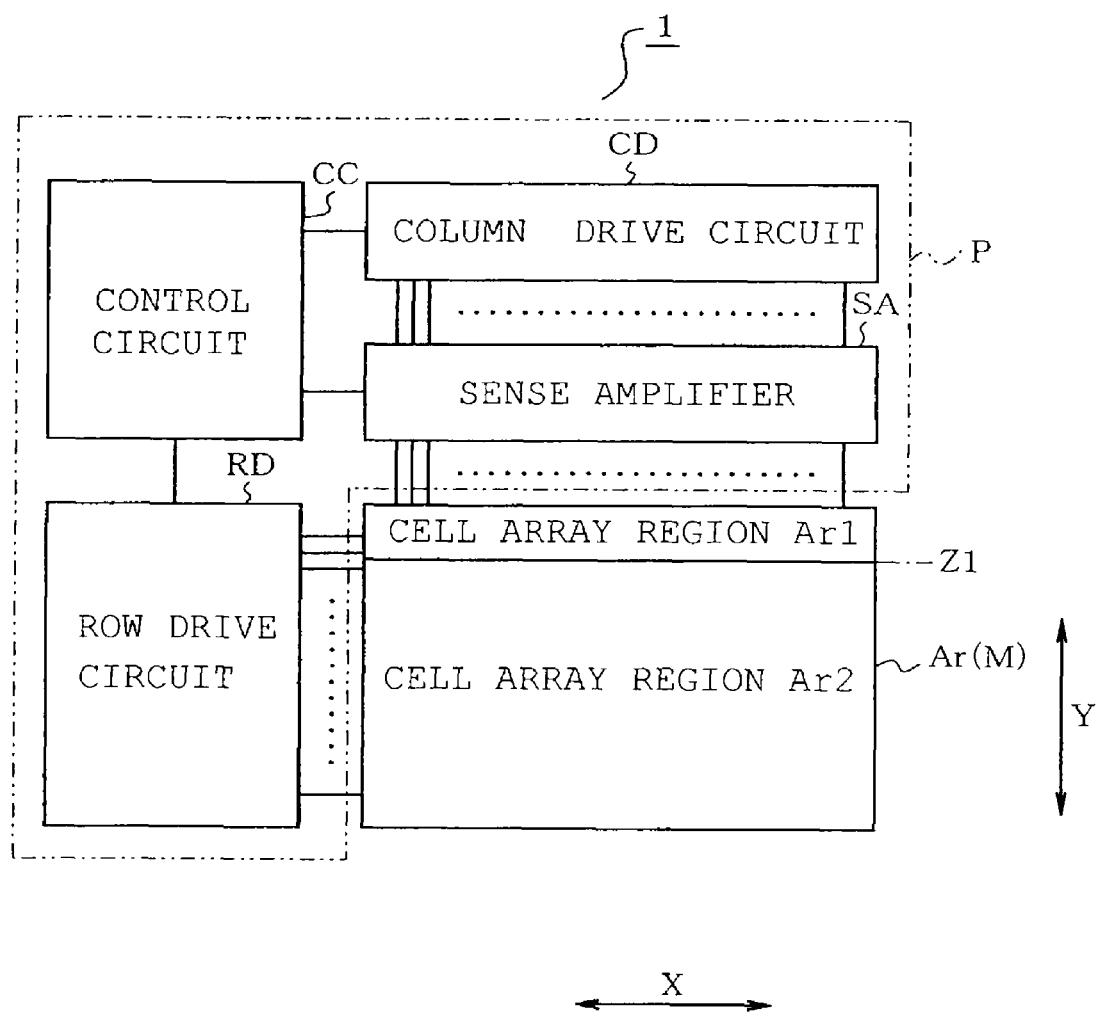
FIG. 1 is a schematic block diagram showing an electrical arrangement of a nonvolatile semiconductor memory device of a first embodiment in accordance with the present invention.

A first embodiment will be described with reference to FIGS. 1 to 20. The first embodiment is applied to a NAND flash memory device. In the embodiment as described below, identical or similar parts are labeled by the same reference numerals in the following description. The drawings typically illustrate the embodiment, and the relationship between a thickness and planar dimension, layer thickness ratio and the like differ from respective natural dimensions.

Referring to FIG. 1, an electrical arrangement of the NAND flash memory device is schematically shown. As shown, the flash memory device 1 comprises a memory cell region M and a peripheral circuit region P. The memory cell region M is provided with a memory cell array Ar including a number of memory cells arranged in a matrix. The memory cell array Ar is divided in the Y direction into two regions, that is, first and second cell array regions Ar1 and Ar2. A boundary Z1 is provided between the cell array regions Ar1 and Ar2 so as to extend in the X direction. The cell array region Ar1 is configured as a buffer memory region storing 1 bit per single memory cell (a single level cell, SLC) as will be described in detail later. The cell array region Ar2 is configured as a multilevel memory cell region storing not less than 2 bits per single memory cell (a multi level cell, MLC).

The peripheral circuit region P is provided with peripheral circuits such as a control circuit CC, a row drive circuit RD, a column drive circuit CD, a sense amplifier SA and the like. The peripheral circuits are provided for executing processes of data readout from each memory cell, data writing onto each memory cell and data erase in each memory cell. These processes are carried out between each peripheral circuit and the memory cell array Ar (Ar1 and Ar2).

Figure 2:
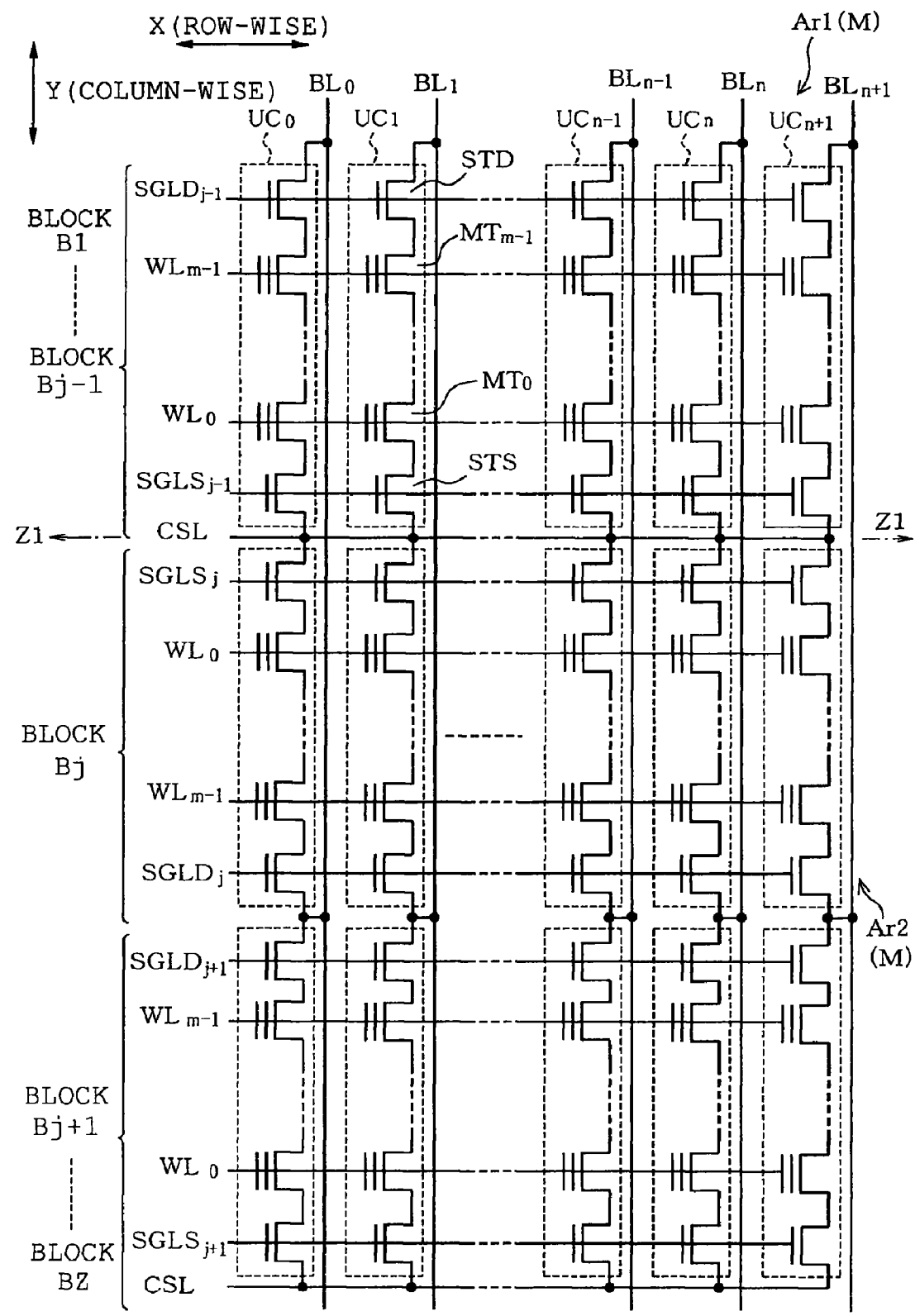
FIG. 2 is a diagram showing an electrical arrangement of part of a memory cell array.

The arrangement of the memory cell array Ar will schematically be described with reference to FIGS. 2 and 3. Referring to FIG. 2, an electrical arrangement of the memory cell array Ar is schematically shown. As shown, the memory cell array Ar located in a memory cell region M is composed of a number of cell units UC (corresponding to a NAND cell unit structure) arranged in a matrix. Each of the cell array regions Ar1 and Ar2 is also composed of a number of cell units UC arranged in a matrix. The cell units UC composing each cell array region have the same electrical arrangement. The memory cells composing each cell unit have different electrical characteristics according to the cell array regions Ar1 and Ar2.

Each cell unit UC ($UC_0, \ldots UC_{n+1}$) comprises a selective gate transistor STD connected to the bit line BL ($BL_0, \ldots BL_{n+1}$) side, a selective gate transistor STS connected to the source line CSL side and a plurality of memory cell transistors MT ($MT_0, \ldots MT_{n-1}$) series-connected between the two (plural) selective gate transistors STS-STD. For example, each cell unit UC has 32 memory cell transistors MT ($m=2^k$) corresponding to memory cells.

In the following description, symbols "UC," "BL," "CSL," and "MT" will be used to designate the cell unit, bit line, source line and memory cell transistor as need arises, respectively. Each cell unit UC is configured so that the selective gate transistors STD and STS and the memory cell transistors MT are aligned in the Y direction (the column-wise, the direction of channel length and the direction of bit line). Columns of the cell units UC the number of which is represented as (n+2) are arranged in parallel in the X direction (the row direction, the direction of channel width and the direction of word line), whereby one block $B_j$ of cell units are configured so as to be aligned in the X direction. The memory cell array Ar comprises a plurality of blocks $B_j$ whose number is represented by "z" and which are arranged in the Y direction. Thus, the memory cell array Ar is composed of blocks $B_1, B_j, B_{j+1} \ldots B_z$. In the following description, symbol "B" will be used for the block as need arises.

The plural cell units UC ($UC_0, \ldots UC_{n+1}$) arranged in the X direction include respective selective gate transistors STD which are electrically connected to one another by a single selective gate line SGLD ($SGLD_j$). The selective gate lines SGLD whose total number is represented by "z" are provided at interval of one block B ($B_j$). The plural cell units UC ($UC_0, \ldots UC_{n+1}$) arranged in the X direction also include respective selective gate transistors STS which are electrically connected to one another by a single selective gate line SGLS ($SGLS_j$). The selective gate lines SGLS ($B_1$ to $B_z$) whose total number is represented by "z" are provided at interval of one block B ($B_j$). In the following description, the selective gate lines will be designated by the symbol "SGLD" or "SGLS" as need arises. The memory cell transistors MT ($MT_0$ to $MT_{m-1}$) having the same suffix are arranged in the X direction are electrically connected to one another by word lines WL ($WL_0$ to $WL_{m-1}$) with the same suffix.

The sense amplifier SA as shown in FIG. 1 is connected to the bit lines BL ($BL_0$ to $BL_{n+1}$) as shown in FIG. 2. A latch circuit (not shown) is connected to the sense amplifier SA so that data to be read out is temporarily stored in the latch circuit during readout of the data. FIG. 3 is a plan view of the memory cell array. As shown, a plurality of element isolation regions SR are formed so as to extend in the Y direction and so as to be spaced away from one another. Active areas AA (active regions) are formed between the element isolation regions SR. Accordingly, the active areas AA extend in the Y direction. The selective gate lines SGLD, the word lines WL and the selective gate lines SGLS extend in the X direction and are spaced away from one another in the Y direction.

Each active area AA includes portions which intersect with the selective gate line SGLD and on which a plurality of selective gate electrodes SGD of the selective gate transistors STD are provided respectively. The selective gate electrodes SGD are connected to one another by the selective gate line SGLD in the X direction. The selective gate transistors STD are formed with bit line contacts CB so that the bit line contacts CB are connected to drains of the active areas AA respectively. The bit line contacts CB are connected to bit lines BL (see FIG. 2) respectively.

The active areas AA include portions which intersect with the selective gate line SGLS and on which selective gate electrodes SGS of the selective gate transistors STS are provided, respectively. The selective gate electrodes SGS are connected to one another by the selective gate line SGLS in the X direction. The selective gate transistors STS have source line contacts CS which are formed so as to be connected to the sources of the active areas AA, respectively. The source line contacts CS are connected in common to a single source line CSL (see FIG. 2). The active areas AA also include portions which intersect with the word line WL and on which gate electrodes MG of the memory cell transistors MT are provided, respectively. These gate electrodes MG are connected to one another by the word line WL in the X direction.

The sectional structure of the cell array region Ar in the direction of the word lines WL will now be described with reference to FIGS. 4A and 4B. FIGS. 4A and 4B illustrate schematic sections taken along lines 4A-4A and 4B-4B in FIG. 3 respectively. As shown, an n-well 2a is formed in a surface layer of the silicon substrate 2 (a p-type silicon substrate, for example), and a p-well 2b is also formed in a surface layer of the n-well 2a. A plurality of element isolation trenches 3 are formed in an upper portion of the p-well 2b. Element isolation insulating films 4 are formed in the element isolation insulating trenches 3 respectively. As a result, an element isolation region SR with a shallow trench isolation (STI) structure is formed. A plurality of element isolation regions SR are formed in the X direction at predetermined intervals so that the active areas AA are separately formed in the surface layer of the semiconductor substrate 2 so as to be separated in the X direction. In each of the cell array regions Ar1 ad Ar2, gate insulating films 5 are formed on upper surfaces of the semiconductor substrate 2 (active area AA) respectively. The gate insulating films 5 are made from a silicon oxide film, for example.

The active areas AA have the same X-direction width in the cell array regions Ar1 and Ar2 a shown in FIGS. 4A and 4B. Polycrystalline silicon layers 6 are formed on upper surfaces of the gate insulating films 5 respectively. The polycrystalline silicon layers 6 function as floating gate electrodes FG (corresponding to electrical charge storage layers). The element isolation insulating films 4 are formed above the upper surface of the semiconductor substrate 2 so as to protrude upward. Each element isolation insulating film 4 is made from a silicon oxide film, for example, and has such a height as to contact side surfaces of the gate insulating films 5 and respective lower side surfaces of the polycrystalline silicon layers 6. The element isolation insulating films 4 are formed so as to have the same X-direction width and upper surfaces having different heights within the cell array regions Ar1 and Ar2.

With further reference to FIGS. 4A and 4B, the element isolation insulating films 4 within the cell array regions Ar1 and Ar2 have upper surfaces 4a and 4b which are formed so as be curved downward into a U-shape, respectively. However, the upper surfaces 4b of the element isolation insulating films 4 in the cell array region Ar2 are formed to include respective central portions which are so high as to be located near the upper surface of the semiconductor substrate 2 and so as to be located lower than the upper portions 4a of the element isolation insulating films 4 in the cell array region Ar1. When the levels of the lower ends or central portions of the upper surfaces 4a and 4b are compared with each other, the level of a lower end 4aa of the upper surface 4a from the upper surface of the semiconductor substrate 2 is higher than the level of a lower end 4ba of the upper surface 4b from the upper surface of the semiconductor substrate 2. In other words, the lower end 4aa of the upper surface 4a is located higher than the lower end 4ba of the upper surface 4b.

Furthermore, the element isolation insulating film 4 includes a contact face in contact with the polycrystalline silicon film 6 in the cell array region Ar1 as shown in FIG. 4A. Symbol "H1" designates a level of an uppermost end of the contact face in the cell array region Ar1. The element isolation insulating film 4 also includes a contact face in contact with the polycrystalline silicon film 6 in the cell array region Ar2 as shown in FIG. 4B. Symbol "H2" designates a level of an uppermost end of the contact face in the cell array region Ar2. The level H1 is higher than the level H2. The reason for this is that the characteristics of the memory cell transistors are set so as to differ between the cell array regions Ar1 and Ar2.

An intergate insulating film 7 is formed on an upper surface and upper side surfaces of the polycrystalline silicon film 6 and along the upper surfaces 4a and 4b of the element isolation insulating film 4. The intergate insulating film 7 is composed of an oxide-nitride-oxide (ONO) film, for example. A word line WL is formed on the intergate insulating film 7. The word line WL connects control gate electrodes CG of the memory cell gate electrodes MG to one another. The word line WL is formed over a plurality of active areas AA and a plurality of element isolation regions SR so as to extend in the X direction. The word line WL is formed further over the floating gate electrodes FG aligned in the X direction. The word line WL is composed of the polycrystalline silicon layer and a conductive layer 8 formed in an upper portion of the polycrystalline silicon layer. The conductive layer 8 is formed by siliciding the polycrystalline silicon layer and is accordingly a silicide layer containing any one of tungsten (W), cobalt (Co), nickel (Ni) and the like. The memory cell transistor MT has a gate electrode MG configured by a stacked gate structure in which the polycrystalline silicon layer 6, intergate insulating film 7 and control gate electrode CG are stacked sequentially.

In the first cell array region Ar1, a first trench 31 corresponds to the element isolation trench 3, and a first element isolation insulating film 41 corresponds to the element isolation insulating film 4. A first gate insulating film 51 corresponds to the gate insulating film 5, and a first charge storage layer 61 corresponds to the polycrystalline silicon layer 6. A first interelectrode insulating film 71 corresponds to the intergate insulating film 7, and a first control electrode 81 corresponds to the conductive layer 8.

Furthermore, in the second cell array region Ar2, a second trench 32 corresponds to the element isolation trench 3, and a second element isolation insulating film 42 corresponds to the element isolation insulating film 4. A second gate insulating film 52 corresponds to the gate insulating film 5, and a second charge storage layer 62 corresponds to the polycrystalline silicon layer 6. A second interelectrode insulating film 72 corresponds to the intergate insulating film 7, and a second control electrode 82 corresponds to the conductive layer 8.

A sectional structure of the active area AA in the drawing direction thereof will now be described with reference to FIG. 5. A selective gate electrode SGD of the selective gate transistor STD is formed above a p-well region 2b with the gate insulating film 5 being interposed therebetween. Selective gate electrodes SGS of the selective gate transistors STS are formed above the p-well region 2b with the gate insulating film 5 being interposed therebetween. The selective gate electrodes SGS are spaced away from a forming region of the selective gate electrode SGD in the Y direction.

The selective gate electrodes SGD and SGS have the same film structure as the gate electrode M of the memory cell transistor MT. The selective gate electrodes SGD and SGS have openings formed in central parts of the intergate insulating films 7. The polycrystalline silicon films 6 and the conductive layers 8 are formed with a material being supplied through the openings so as to be in contact with each other, whereupon the polycrystalline silicon films 6 and the conductive layers 8 are electrically short-circuited. Impurity diffusion layers 2c serving as source/drain are formed in a surface layer of the semiconductor substrate 2 so as to be located between the gate electrodes MG, between the gate electrode MG and the selective gate electrode SGD and between the gate electrode MG and the selective gate electrode SGS respectively. An impurity diffusion layer 2d having a lightly doped drain (LDD) structure is formed in a surface layer of the semiconductor substrate 2 so as to be located between the selective gate electrodes SGS respectively. Source line contacts CS are located on the impurity diffusion layers 2d respectively. Source lines CSL such as a local source line are located on the source line contacts CS respectively.

Figure 3:
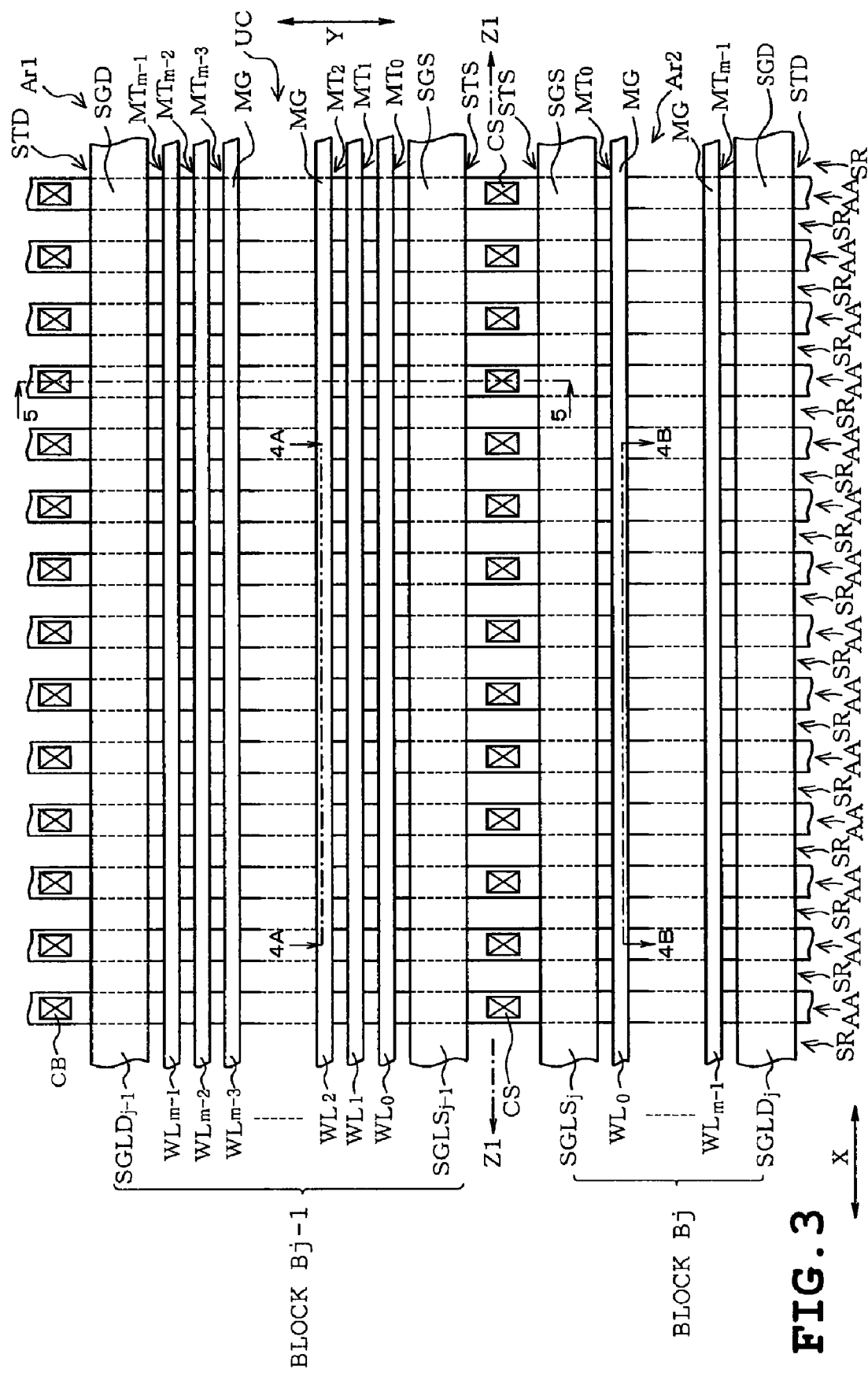
FIG. 3 is a plan view showing the structure of the memory cell array.
Figure 4A:
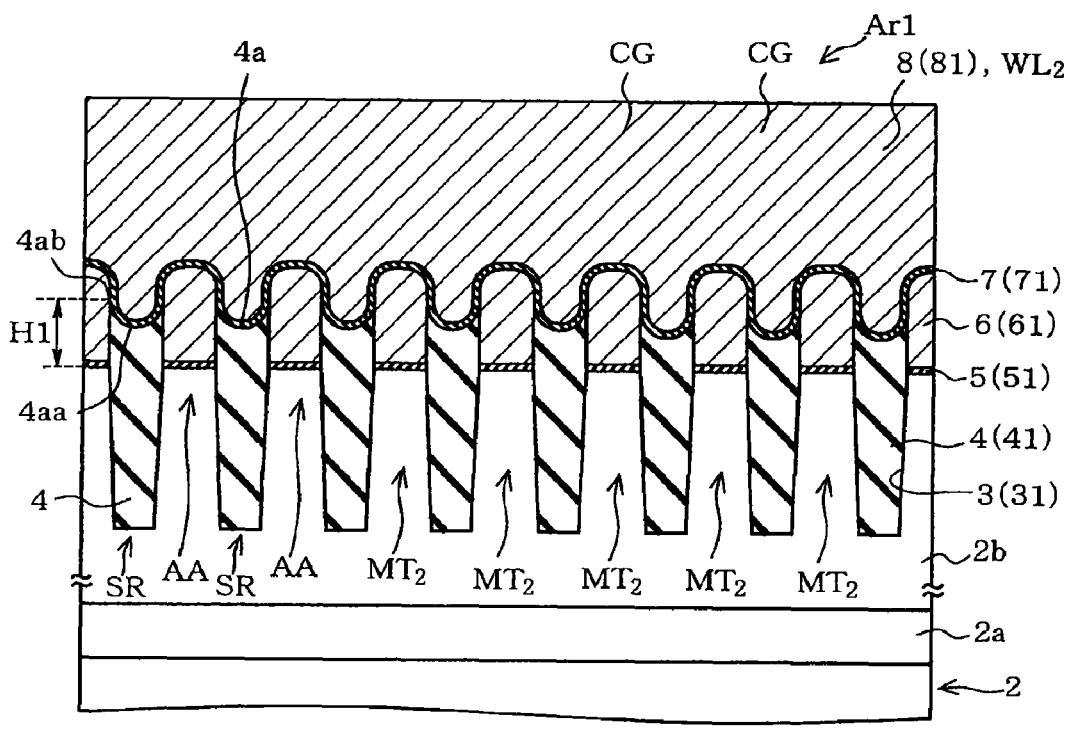
FIGS. 4A and 4B are schematic longitudinal sections of taken along lines 4A-4A and 4B-4B in FIG. 3 respectively.
Figure 4B:
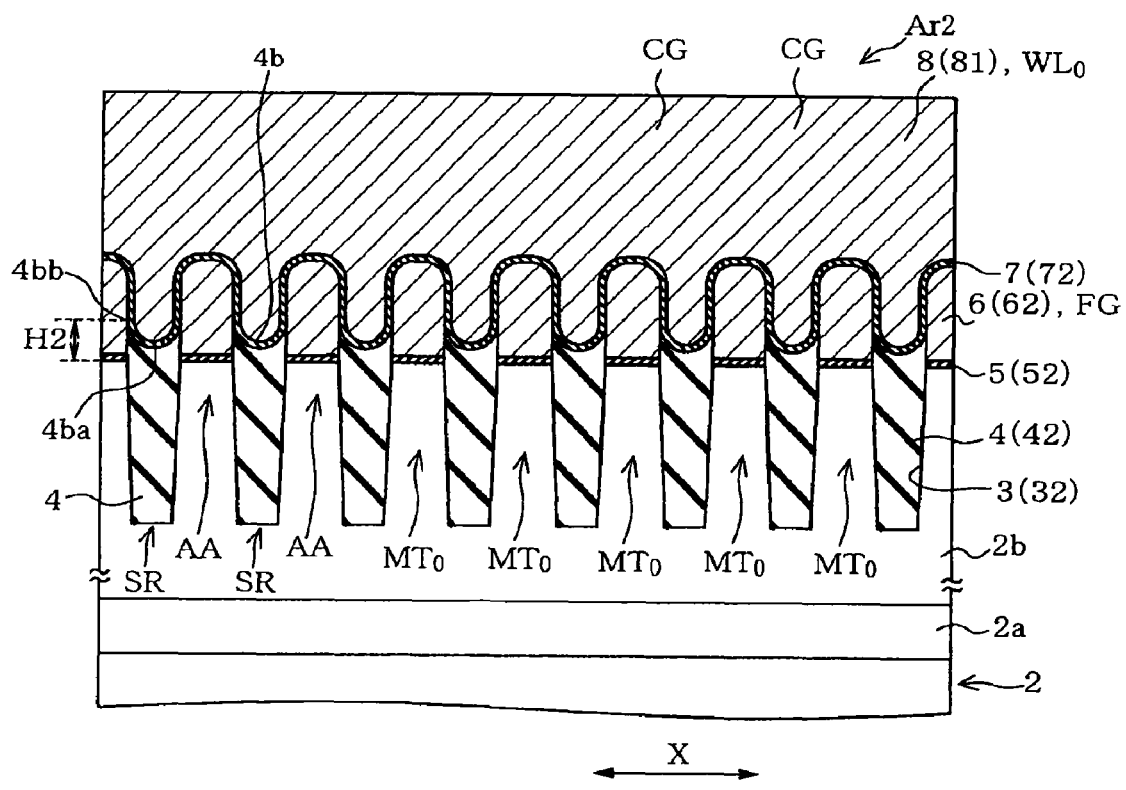
Figure 5:
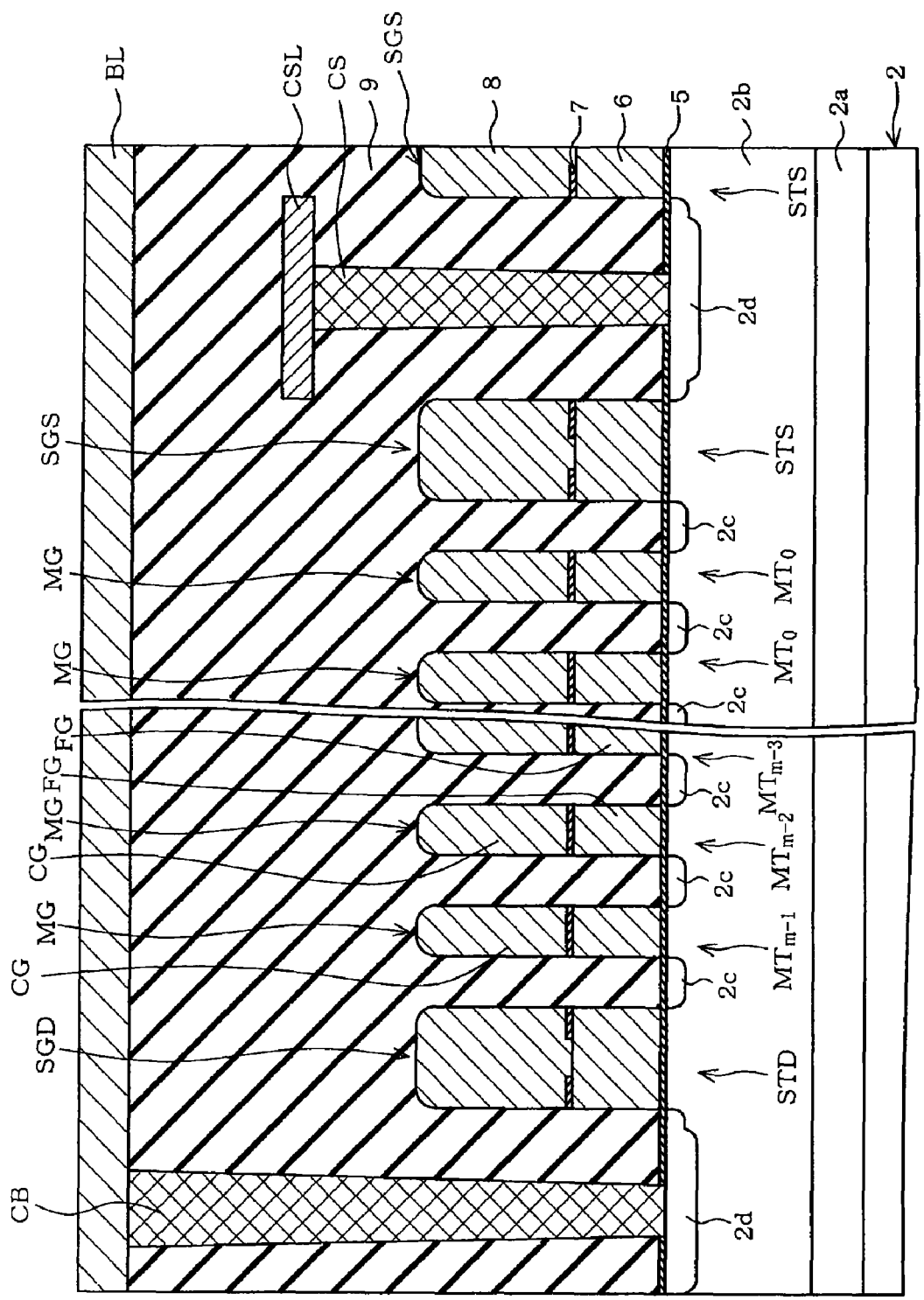
FIG. 5 is a schematic longitudinal section taken along line 5-5 in FIG. 4.

Two selective gate electrodes SGD are disposed so as to be opposed to each other in the Y direction with the bit line contact CB being interposed therebetween although not shown in FIGS. 3 and 5. An impurity diffusion layer 2d having the LDD structure is formed in a surface layer of the semiconductor substrate 2 so as to be located between the selective gate electrodes SGD. Bit lines BL are formed so as to extend from an upper end of the bit line contact CB in the Y direction. An interlayer insulating film 9 comprising a silicon oxide film, for example is formed between the gate electrodes MG, between the gate electrodes MG and the selective gate electrode SGD, and between the gate electrode MG and the selective gate electrode SGS. The interlayer insulating film 9 is also formed on the upper surfaces of the gate electrodes MG and the selective gate electrodes SGD and SGS, whereupon an electrical insulation is provided between the gate electrodes MG, SGD and SGS and other electrical components (bit line contacts CB, source line contacts CS, bit lines BL and source lines CSL, for example).

Figure 6:
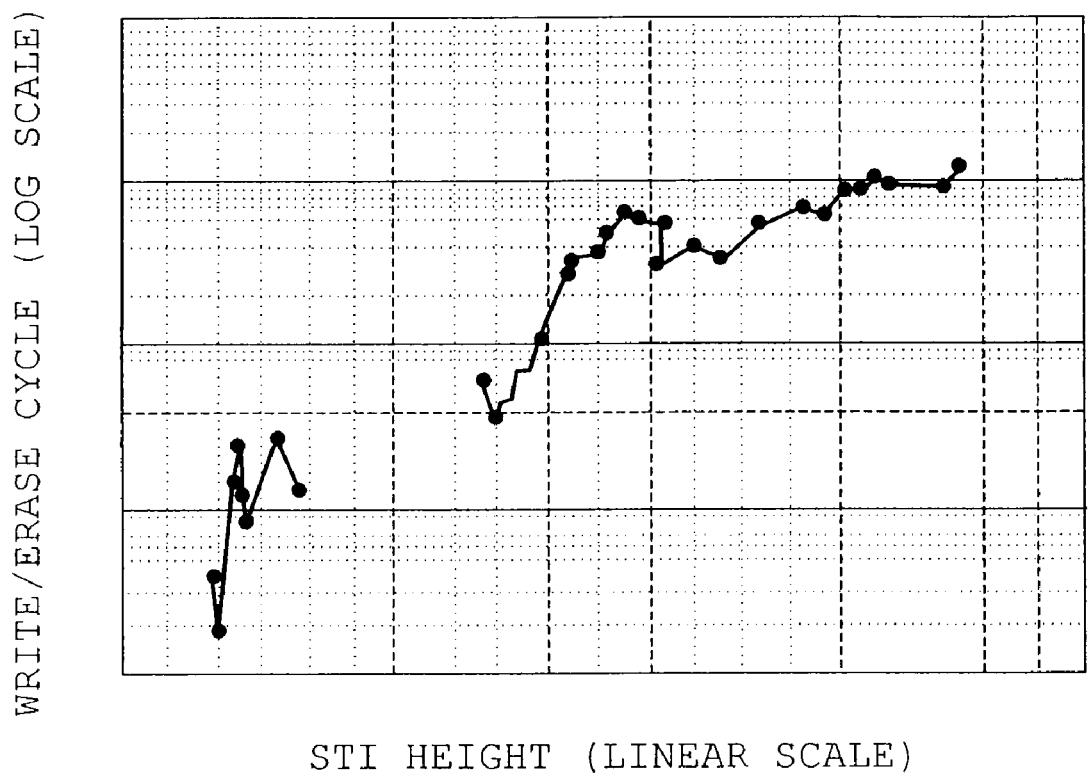
FIG. 6 is a graph showing the relationship between write/erase cycle and shallow trench isolation (STI) height.

FIG. 6 shows the measurement results of the level dependency of a write/erase cycle (possible number of times of rewriting) upon the element isolation insulating film 4 of the element isolation insulating film 4. The axis of ordinate of the graph indicates the write/erase cycle measured with the use of a predetermined reliability evaluation index. The axis of abscissas of the graph indicates a level (levels H1 and H2) of the element isolation insulating film 4 (STI). The ordinate axis represents values measured on the log scale, whereas the abscissa axis represents values measured on the linear scale. Both values are relative to each other.

When data is rewritten by the flash memory device 1, data of the memory cell transistor MT is generally erased and thereafter, data is written onto the memory transistor MT. When erasing and writing are executed repeatedly, characteristics of memory cells are deteriorated, whereupon there is a possibility that a time necessary for data writing may be prolonged or data cannot be written. In view of the circumstances, the write/erase cycle is set in anticipation of a predetermined margin.

As shown in FIG. 6, it can be confirmed that the write/erase cycle (or write/erase endurance) is exponentially increased along with increase in the levels H1 and H2 of the upper surfaces 4a and 4b of the element isolation insulating film 4. Accordingly, the level of the upper surface 4a of the element isolation insulating film 4 in the cell array region Ar1 is set so as to be higher than the level of the upper surface 4b of the element isolation insulating film 4 in the cell array region Ar2 in the structure of the embodiment. Consequently, the write/erase cycle of the memory transistor MT in the cell array region Ar1 can be increased as compared with the write/erase cycle of the memory transistor MT in the cell array region Ar2.

Thus, since the memory cell transistor MT in the cell array region Ar1 has a higher write/erase cycle performance, the memory cell transistor MT functions particularly effectively when used as a buffer memory region in which a write/erase process is frequently repeated. The reason for this is that a buffer memory is used as a region to store data temporarily and needs to be rewritable in a shorter time and more frequently than a region to store data for a longtime in a nonvolatile manner. Furthermore, in the embodiment, the cell array region Ar1 is used as a region having a storage capacity of 1-bit per memory cell in order that a write/read speed of each memory cell transistor in the cell array region Ar1 may be improved.

On the contrary, the memory cell transistor MT in the cell array region Ar2 has a lower write/erase cycle than the memory cell transistor MT in the cell array region Ar1 from the above-described relationship. On the other hand, when focusing attention on the individual characteristics of the memory cell transistors MT, the memory cell transistor MT in the cell array region Ar2 has a larger coupling ratio than the memory cell transistor MT in the cell array region Ar1 since a counterpart area between the control electrode CG and the floating gate electrode FG is wider in the memory cell transistor MT in the cell array region Ar2 than in the cell array region Ar1. As a result, the memory cell transistor MT of the cell array region Ar2 has a better write characteristic than the memory cell transistor MT of the cell array region Ar1, whereupon the cell array region Ar2 functions particularly effectively when used as a multilevel storage region to store data for a long time.

For the foregoing reasons, the cell array region Ar1 is used as the buffer memory region and the cell array region Ar2 is used as the multilevel storage region having a storage capacity of 2 bits per memory cell or above. The cell array region Ar1 has a larger number of rewrite operations than the cell array Ar2. Occupied areas of the cell array regions Ar1 and Ar2 are adjusted and set according to a ratio of the numbers of rewrite operations of the cell array regions Ar1 and Ar2. More specifically, for example, the cell array regions Ar1 and Ar2 are configured so that the cell array region Ar2 has a wider occupied area than the cell array region Ar1. Accordingly, the NAND flash memory device can be designed to be used in a manner suitable for cell array regions Ar1 and Ar2 in consideration of a rewriting manner that data in the cell array region Ar2 is rewritten once while data in the cell array region Ar1 is rewritten at a plurality of times (twice to four times, for example). Consequently, the number of rewrite operations of the entire memory cell array Ar can comprehensively be increased when the device structure in each of the cell array regions Ar1 and Ar2 is previously adjusted so that a ratio of the numbers of rewrite operations corresponding to an effective ratio is reached, whereby a service life of the device can be improved (wear leveling).

Furthermore, a total memory capacity of each of the cell array regions Ar1 and Ar2 is adjusted according to a ratio of the numbers of rewrite operations of the cell array regions Ar1 and Ar2. More specifically, the total memory capacity of the cell array region Ar2 is set to be larger than the total memory capacity of the cell array region Ar1 in order that a storage capacity of the nonvolatile memory device may be increased.

Figure 7:
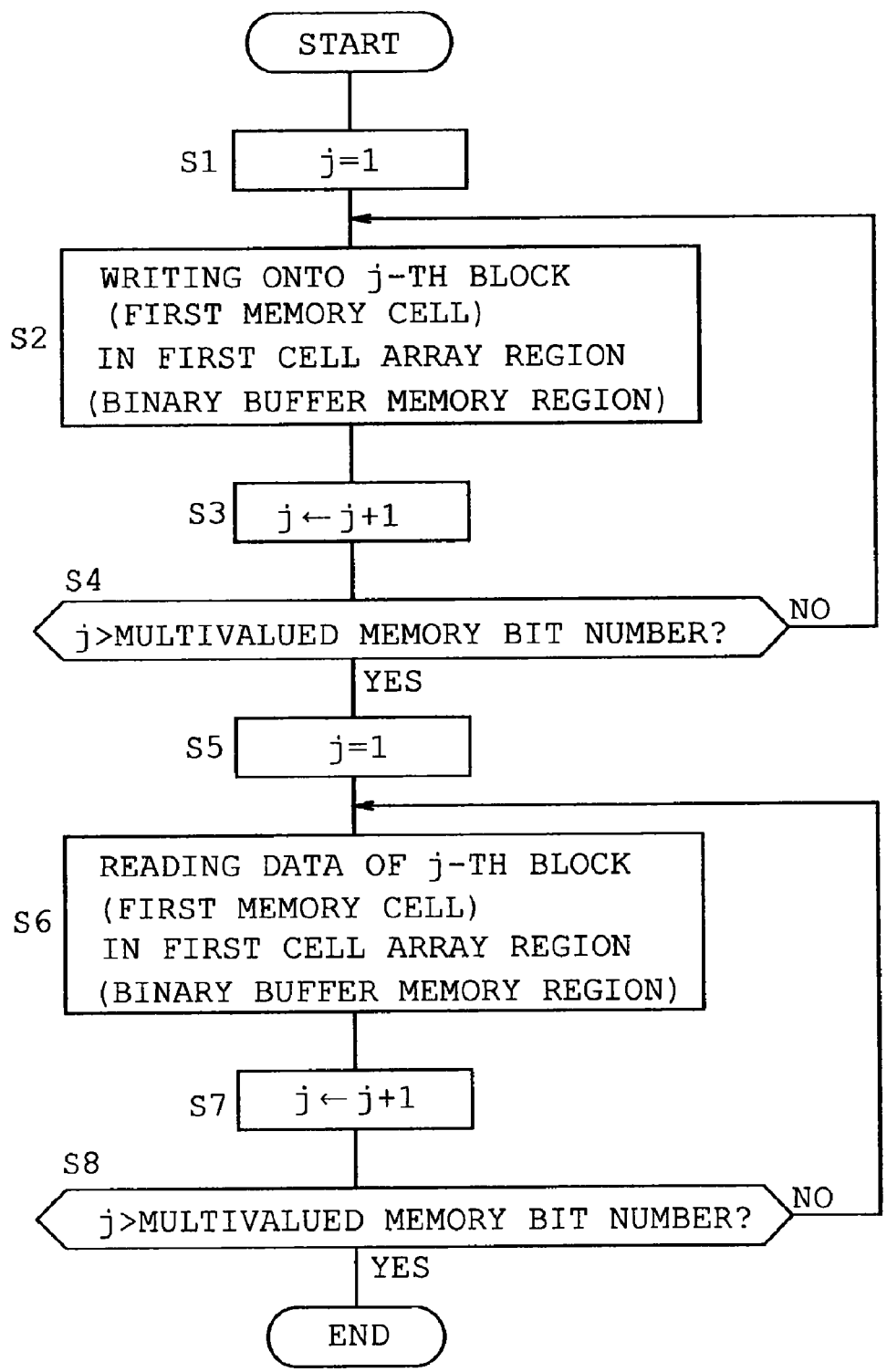
FIG. 7 is a flowchart showing an example of writing.
Figure 8:
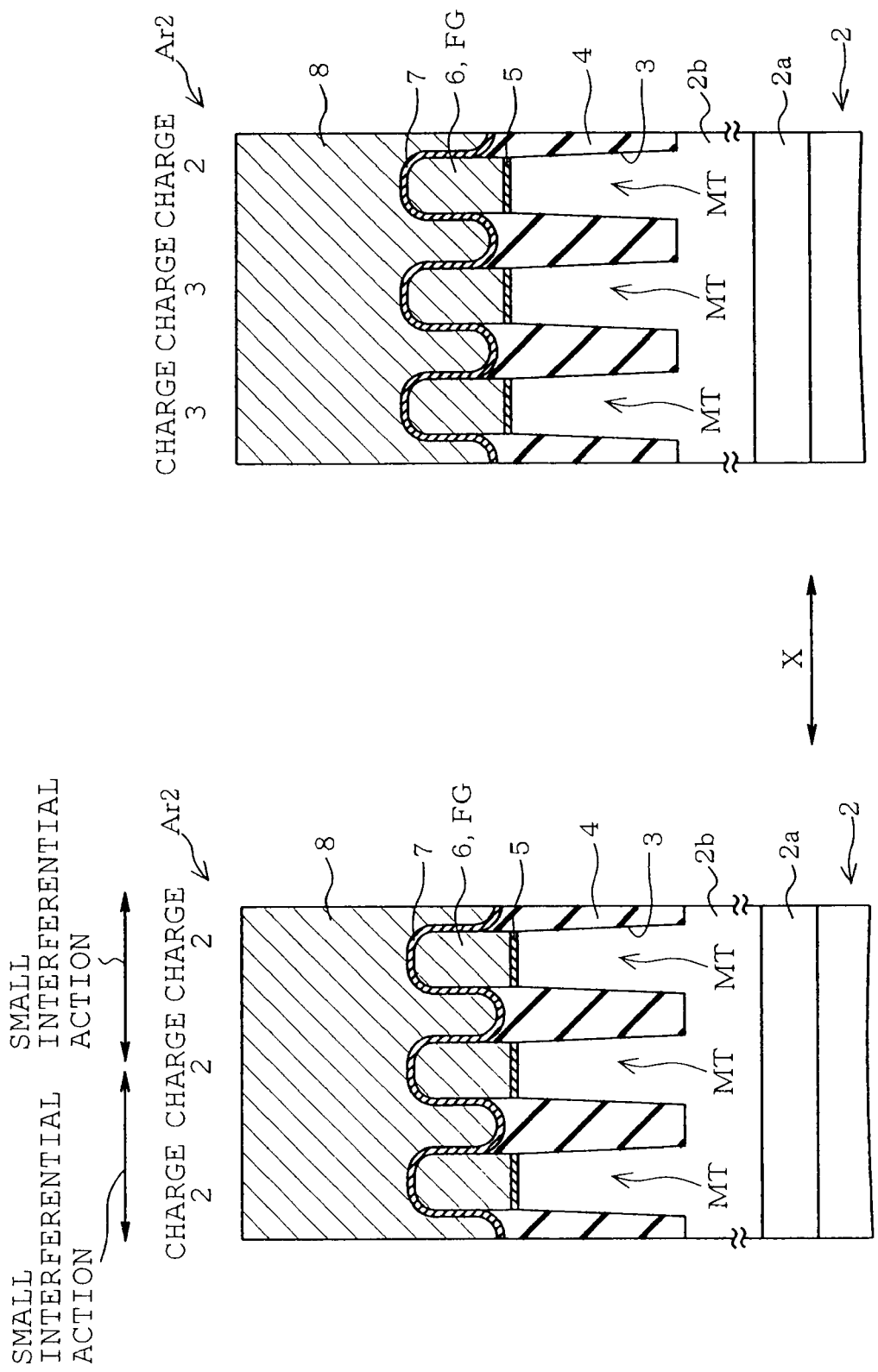
FIGS. 8A and 8B schematically show a flow of writing.

FIGS. 7 and 8 illustrate an example of use of a buffer memory region and a multilevel storage region in one memory cell array Ar. When a single memory cell transistor MT stores 2-bits, the control circuit CC in the cell array region Ar2 (multilevel storage region), the control circuit CC adjusts stored charge of the floating gate electrode FG of the memory cell transistor MT in four levels, thereby adjusting a threshold voltage of the each memory cell transistor MT to one of four threshold voltages.

When a single memory transistor MT stores 3 or 4 bits, the control circuit CC adjusts stored charge of the floating gate electrode FG of the memory cell transistor MT in 8 or 16 levels, thereby adjusting a threshold voltage Vt of the each memory cell transistor MT to one of 8 or 16 threshold voltages. Thus, as the number of memory bits per memory cell is increased, the number of distributed threshold values Vt of the memory cell transistor MT is increased and a margin voltage between a plurality of adjacent distributions. Furthermore, when a distance between adjacent memory transistors MT becomes shorter with recent reduction in the design rules and refinement in the microstructure of semiconductor devices, a threshold voltage Vt of the memory cell transistor MT is apt to be susceptible to the influence of charge stored in the floating gate FG of the adjacent memory cell transistor and the threshold voltage Vt becomes variable.

In view of the above-described problem, the embodiment provides a write process as shown in FIGS. 7 and 8A and 8B. For the sake of easy understanding, the memory cell transistor MT stores 2 bits in the cell array region Ar2. FIG. 7 shows a flow of principal processing in a date write process by the control circuit CC. FIGS. 8A and 8B schematically show changes in stored charge in the floating gate electrode when the data write process has been carried out by the control circuit CC.

For example, binary data "&B11," "&B11" and "&B10" are to be written onto three memory cell transistors MT in the cell array region Ar2 shown in FIGS. 8A and 8B respectively. In each of FIGS. 8A and 8B, the stored charge amounts of the floating gate electrodes FG are shown in four levels (0, 1, 2 and 3). As shown in FIG. 7, the control circuit CC assigns "1" to a variable j (S1), writing data a j-th block in the first cell array region Ar1 (buffer memory region) (S2). Data to be written is binary data, and the control circuit CC initially writes a value of an upper digit (initially, a second digit) of 2 bits to be written onto a predetermined block in the second cell array region (multilevel storage region). More specifically, the control circuit CC writes second digit data "&B1," "&B1" and "&B1" of the aforesaid binary data "&B11," "&B11" and "&B11" onto the binary memory cell transistors MT in the cell array region Ar1 corresponding to three multilevel memory cell transistors MT in the cell array region Ar2 respectively.

Subsequently, the control circuit CC increments the variable j (S3) and determines whether the incremented variable j is larger than the multilevel storage bit number per memory cell (2 because of 2 bits in this case) (S4). More specifically, the control circuit CC determines whether data of binary complete digit to be written has been written onto a plurality of blocks B in the first cell array region Ar1 for every digit of the binary.

When the variable j has not exceeded the multilevel storage bit number per memory cell (NO at S4), the control circuit CC determines that complete digit data has not been written on the block B of the first cell array region Ar1, returning to step S2 to write binary complete digit data onto a plurality of blocks in the first cell array regions Ar1, repeatedly. More specifically, when repeating the processes at steps S2 to S4 twice, the control circuit CC writes data of binary second digit onto the first block of the first cell array Ar1 and further writes data of binary first digit onto the second block of the first cell array Ar1. Subsequently, when the variable j has exceeded the multilevel storage bit number per memory cell (YES at S4), the control circuit CC completes writing onto the plural blocks in the first cell array region Ar1.

The control circuit CC then returns the variable j to 1 (S5) and reads data of the j-th block in the first cell array region Ar1, writing the read data onto a predetermined block (a block on which data is to be written) in the second cell array region Ar2 (S6). The control circuit CC then increments the variable j (S7) and repeats the processes at steps S6 to S8 until the variable j becomes larger than the number of multilevel storage bits per memory cell (2 because of 2 bits in this case) (YES at S8). More specifically, in the embodiment, when repeating CC repeats the processes at steps S6 to S8 twice, the control circuit CC reads data of binary second digit from the first block B of the first cell array region B and writes the read data onto a predetermined block B of the second cell array region Ar2. The control circuit CC then reads data of binary first digit from the second block B of the first cell array region Ar1, rewriting the read data onto a predetermined target block B in the second cell array region Ar2.

The following will describe changes in the charge amount stored in the floating gate electrode FG in the case where data is written onto the cell array region Ar2 in a manner as described above, with reference to FIGS. 8A and 8B. After the processes at steps S6 to S8 in FIG. 7 have been carried out once, electrical charge (electrons) is stored by amounts represented by levels 2, 2 and 2 corresponding to data of binary second digits "&B1," "&B1" and "&B1" respectively, as shown in FIG. 8A. Subsequently, after the processes at steps S6 to S8 in FIG. 7 have been repeated, amounts of charge stored in the floating gate electrodes FG of the memory cell transistors MT are increased according to data of binary first digit "&B1," "&B1" and "&B0" as shown in FIG. 8B, so that amounts of charge (electrons) are stored as indicated by levels 3, 3 and 2, respectively.

Thus, electrical charges whose amounts are indicated by levels 3, 3 and 2 are stored in the floating gate electrodes FG of the memory cell transistors MT respectively. The threshold voltages Vt of the memory cell transistors MT are also changed according to amounts of charge stored respectively. As a result, multilevel data can be written gradually.

Figure 9:
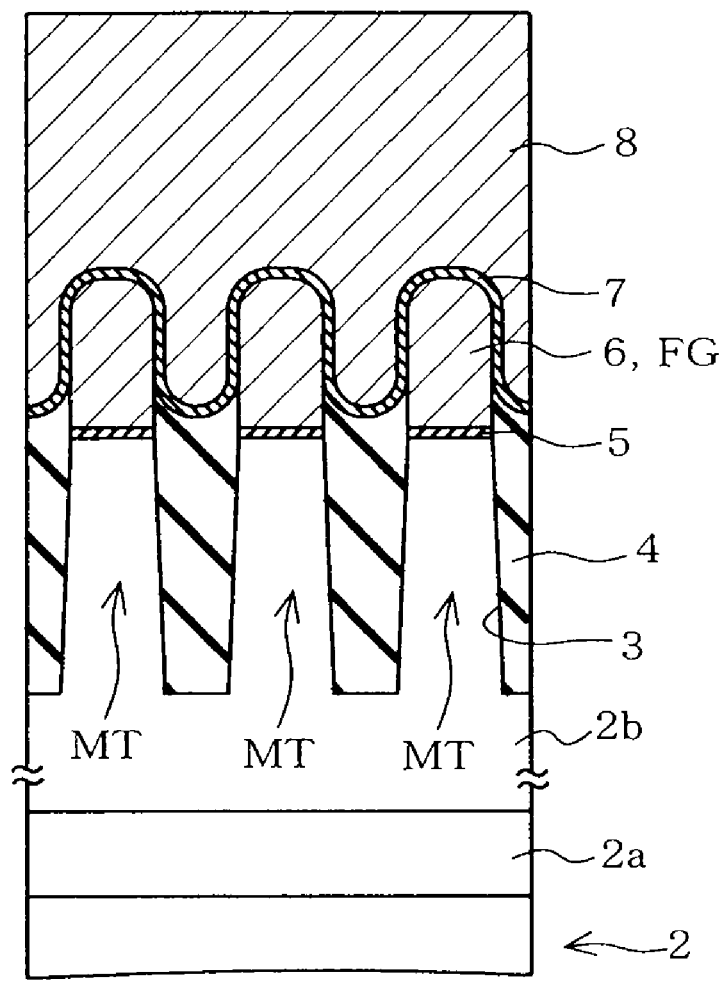
FIG. 9 is a view similar to FIG. 8A, showing a comparative example.

FIG. 9 shows a comparative example of changes in amounts of charge stored in the floating gate electrodes FG in the case where data is written onto respective memory cell transistors MT without application of the processes as shown in FIG. 7. In the example of FIG. 9, a control circuit CC applies predetermined voltages to regions such as source lines CSL, bit lines BL and p-well 2b so that the memory cell transistor MT of a centrally located cell unit in FIG. 9 is selected for data write and data is not written onto the memory cell transistors MT of the cell units located at both sides of the central cell unit.

The control circuit CC carries out a process of injecting level 3 charge corresponding to data "&B11" into the floating gate FG of the memory cell transistor MT of the cell unit UC selected for data write and not injecting charge into the floating gates FG of the memory cell transistors MT adjacent in the X direction. In this case, although the adjacent memory cell transistors MT are controlled so that electrical charge is not injected into the floating gates FG thereof as described above, the electrical charge may move from the floating gate FG of the memory cell transistor MT selected for data write through the element isolation insulating film 4, the intergate insulating film 7 or the like to the floating gates FG of the memory cell transistors MT or move around the gate insulating films 5 under the floating gate electrodes FG, thereby remaining as fixed charge.

Thus, when writing of data is carried out for only one floating gate electrode FG of a selected memory cell transistor MT, non-selected memory cell transistors MT around the selected one (in the X or Y direction) are adversely affected. The memory cell transistors MT are more susceptible to this adverse effect when recent reduction in the design rules and refinement in the microstructure of semiconductor devices are conspicuous. In the embodiment, however, the first cell array region Ar1 is used as the buffer memory region. Data is stored on each of the plural blocks B in the buffer memory region for every binary digit. The stored data is then read for every digit, for example, sequentially from an upper digit to a lower digit and sequentially written onto a predetermined block B in the second cell array region Ar2. Consequently, the device is less susceptible to an interferential action between the adjacent memory cell transistors MT, and data can be written without influence of the interferential action.

The margin voltage of the threshold voltage Vt of each memory cell transistor is reduced when the storage capacity of each memory cell is increased to 3 or 4 bits, exceeding 2 bits. Accordingly, the aforementioned adverse effect is more conspicuous. As a result, the above-described configuration is particularly advantageous.

A method of fabricating the above-described configuration will now be described. The following description is mainly directed to a process of fabricating the cell array regions Ar1 and Ar2, and the description of a process of fabricating the peripheral circuit region P will be eliminated. The sequence of steps in the fabrication process may be changed as the need arises, and ordinary steps or steps for forming other regions which are not shown may be added. Furthermore, one or more steps in the following description may be eliminated.

Figure 10:
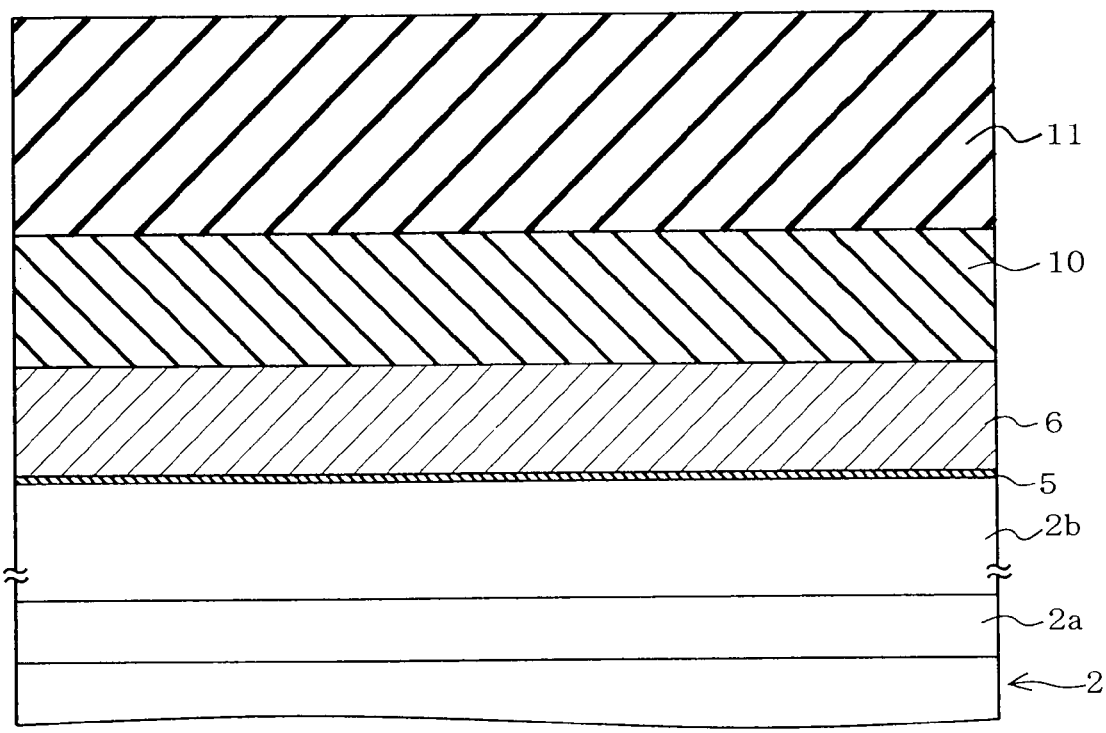
FIG. 10 is a schematic longitudinal section taken along line 4A-4A or line 4B-4B in FIG. 3, in a stage of fabrication (No. 1)

An n-well 2a and a p-well 2b are formed on the semiconductor substrate 2 (a p-type silicon substrate, for example) in turn, and ion implant is carried out for the forming of a channel region, as shown in FIG. 10. An oxide film is then formed on an upper surface of the semiconductor substrate 2 by a thermal oxidation method so as to have a predetermined film thickness (8 nm, for example). The oxide film serves as a gate insulating film 5. Amorphous silicon doped with n-type impurities such as phosphor is deposited on the gate insulating film 5 by a chemical vapor deposition (CVD) method so as to have a predetermined film thickness. A silicon nitride film 10 and a silicon oxide film 11 are then deposited in turn by the CVD method so as to have respective predetermined film thicknesses. The amorphous silicon functions as a floating gate electrode FG and is polycrystallized by a subsequent thermal process into a polycrystalline silicon layer 6. The silicon nitride film 10 functions as a polishing stopper material in execution of a chemical mechanical polishing (CMP) method, and the silicon oxide film 11 is formed as a mask for a reactive ion etching (RIE) method.

Figure 11:
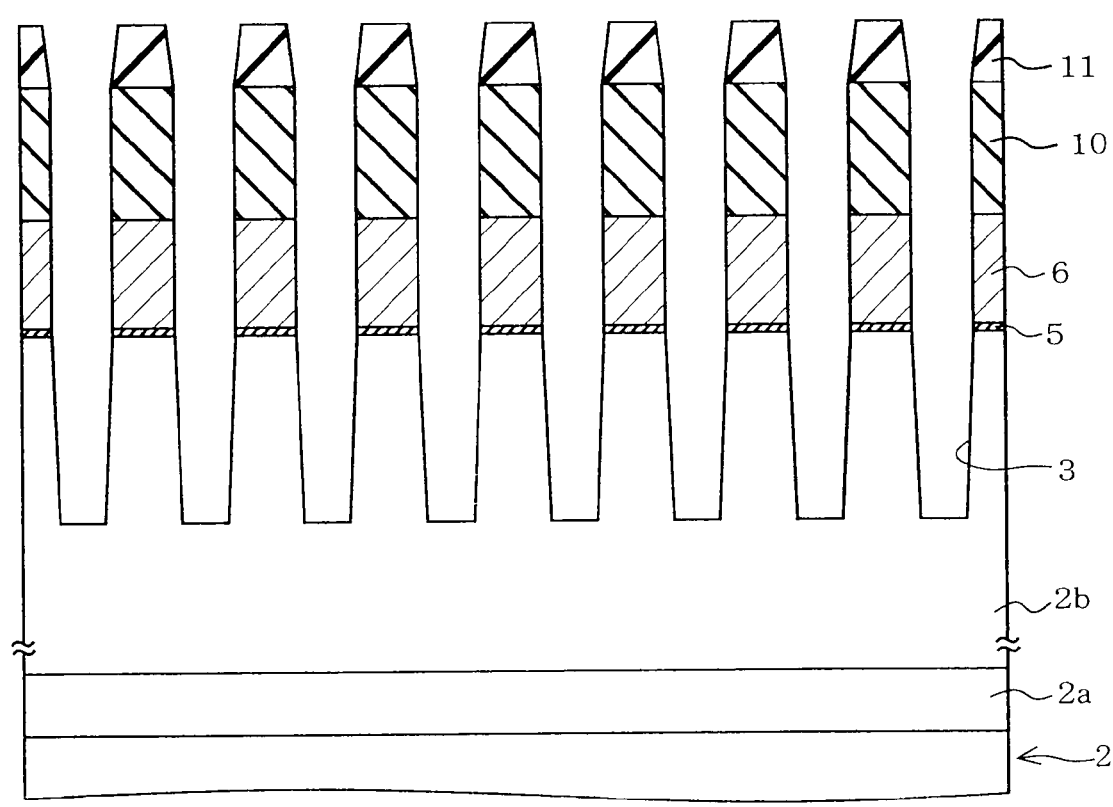
FIG. 11 is a schematic longitudinal section taken along line 4A-4A or line 4B-4B in FIG. 3, in a stage of fabrication (No. 2)

A photoresist (not shown) is coated thereby to be patterned by a lithography technique. The silicon oxide film 11 is processed by the RIE method with the patterned resist serving as a mask as shown in FIG. 11, whereby a hard mask is formed. Subsequently, the photoresist is eliminated by ashing and etching with the use of a mixture of sulfuric acid and hydrogen peroxide solution. Subsequently, the silicon nitride film 10, polycrystalline silicon layer 6, gate insulating film 5 and an upper part of the semiconductor substrate 2 are sequentially processed by the RIE method with the processed silicon oxide film 11 serving as the hard mask, whereby the element isolation trenches 3 are formed. Subsequently, reactive products resulting from the RIE process are removed by a dilute hydrofluoric acid treatment.

Figure 12:
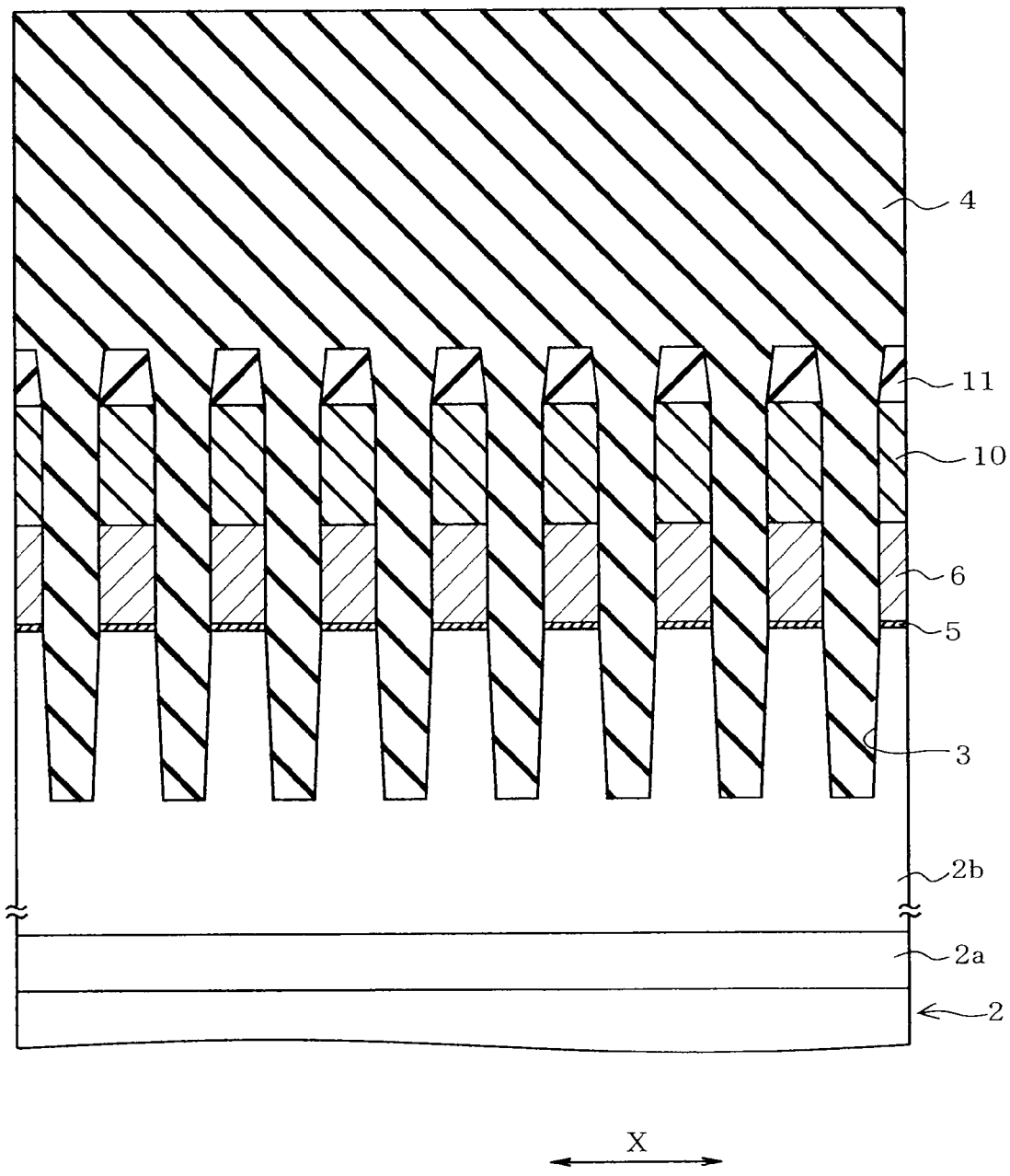
FIG. 12 is a schematic longitudinal section taken along line 4A-4A or line 4B-4B in FIG. 3, in a stage of fabrication (No. 3)
Figure 13:
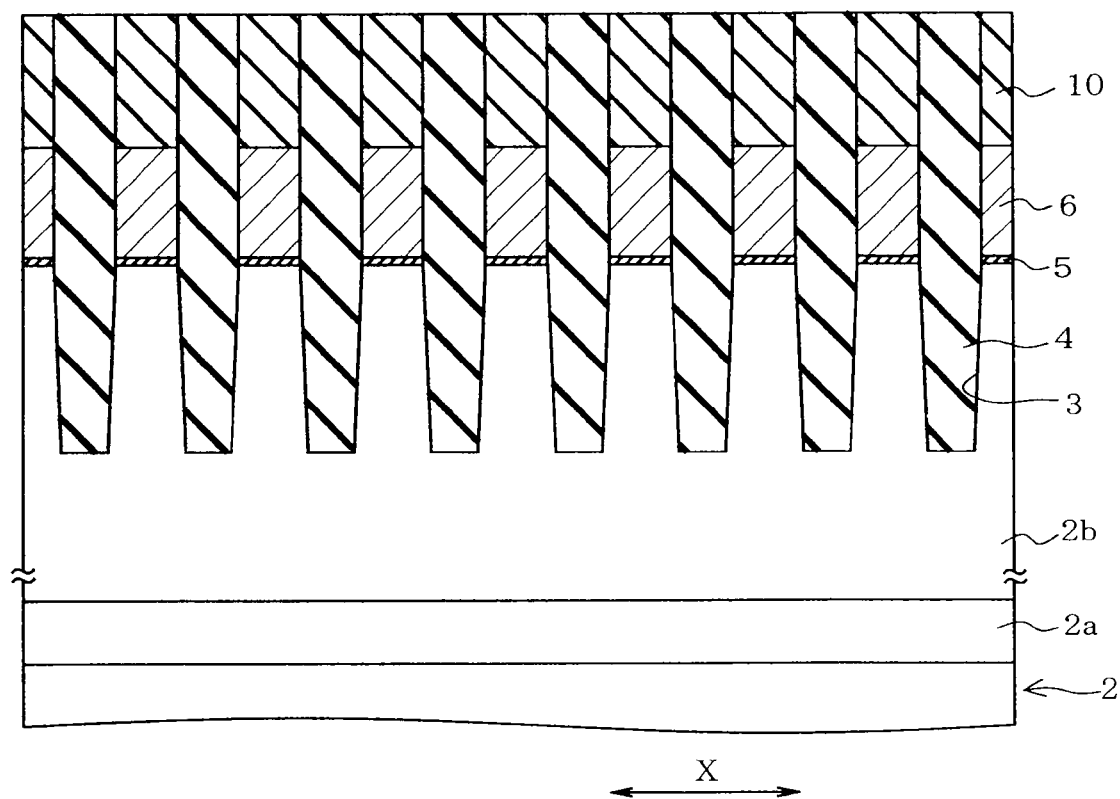
FIG. 13 is a schematic longitudinal section taken along line 4A-4A or line 4B-4B in FIG. 3, in a stage of fabrication (No. 4)

The element isolation insulating film 4 is then formed in the element isolation trenches 3 as shown in FIG. 12. The element isolation insulating film 4 is formed into a stacked structure of a high temperature oxide (HTO) film and a silicon oxide film obtained by annealing a coating type insulating film. The HTO film is formed by a low pressure CVD (LPCVD) method, and the coating type insulating film is formed by a coating method. Subsequently, the element isolation insulating film 4 is planarized by a chemical mechanical polishing (CMP) method with the silicon nitride film 10 serving as a stopper as shown in FIG. 13. The element isolation insulating film 4 is caused to remain in the element isolation trenches 3 of the semiconductor substrate 2.

Figure 14:
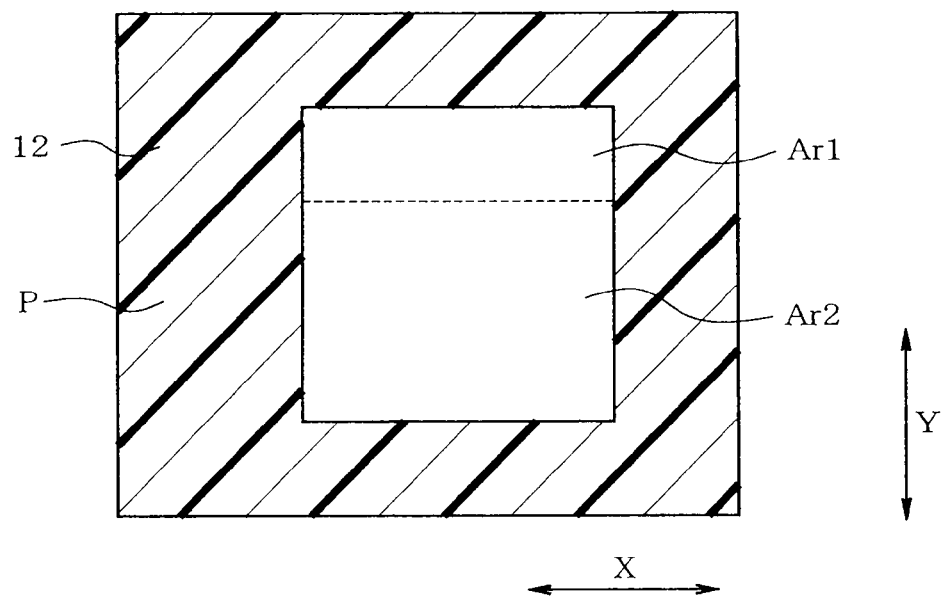
FIG. 14 is a schematic plan view of a mask-covered region (No. 1)
Figure 15:
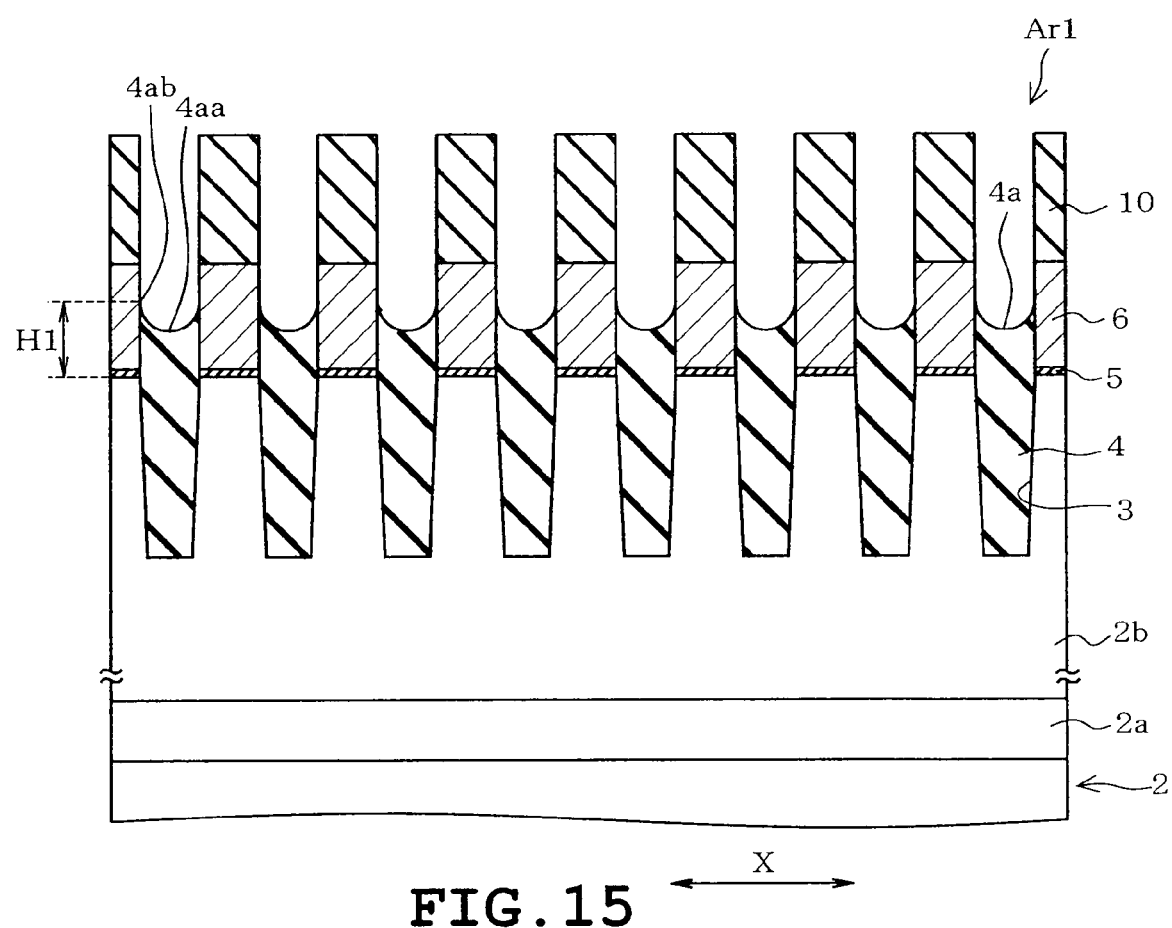
FIG. 15 is a schematic longitudinal section taken along line 4A-4A or line 4B-4B in FIG. 3, in a stage of fabrication (No. 5)

FIG. 14 illustrates a mask-pattern forming region in a subsequent step. As shown, a mask pattern 12 is formed in the peripheral circuit region P except for the cell array regions Ar1 and Ar2. The mask pattern 12 is formed by patterning a resist by the lithography technique, for example. Subsequently, an upper part of the element isolation insulating film 4 is etched by the RIE method with the mask pattern 12 serving as a mask, and the mask pattern 12 is then removed, as shown in FIG. 15. In this case, the RIE process is executed under the conditions where the silicon oxide film can be etched with the polycrystalline silicon film 6 being given a higher selectively. Furthermore, an etching time is adjusted so that the upper surfaces 4a and 4b of the element isolation insulating film 4 in the regions Ar1 and Ar2 are located below an upper surface of the silicon nitride film 10 and above an upper surface of the gate insulating film 5. FIG. 15 shows a sectional structure in the cell array region Ar1, and the cell array region Ar2 also has the same sectional structure at this time.

Figure 16:
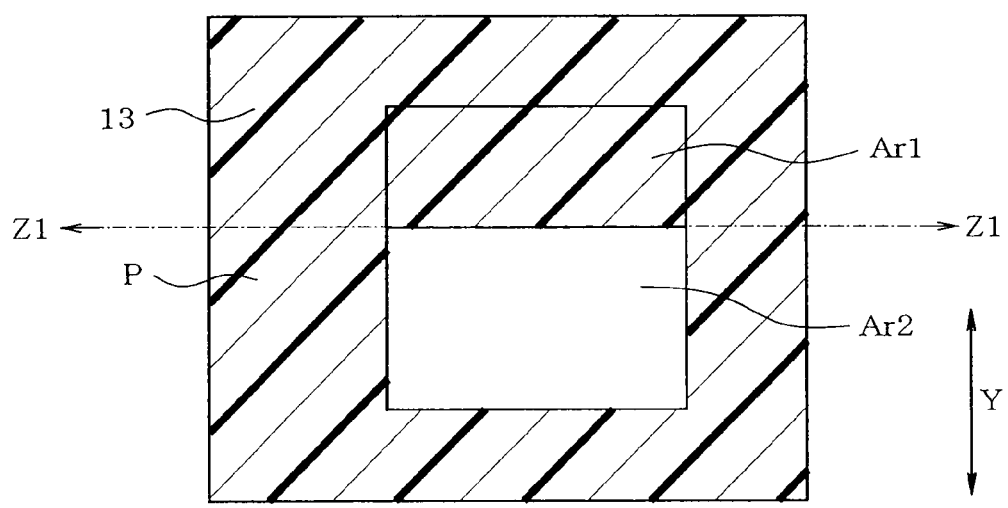
FIG. 16 is a schematic plan view of a mask-covered region (No. 2)

FIG. 16 illustrates a mask-pattern forming region in a subsequent step. As shown, a mask pattern 13 is formed in a region including the peripheral circuit region P and the cell array region Ar1. The mask pattern 13 is formed by patterning a resist by the lithography technique, for example. FIG. 16 further shows a boundary Z1 of the mask pattern 13 in the Y direction between the cell array regions AR1 and Ar2. The boundary Z1 is provided along a portion where source line contacts CS are to be aligned, between adjacent selective gate lines SGLS of the block B.

Figure 17A:
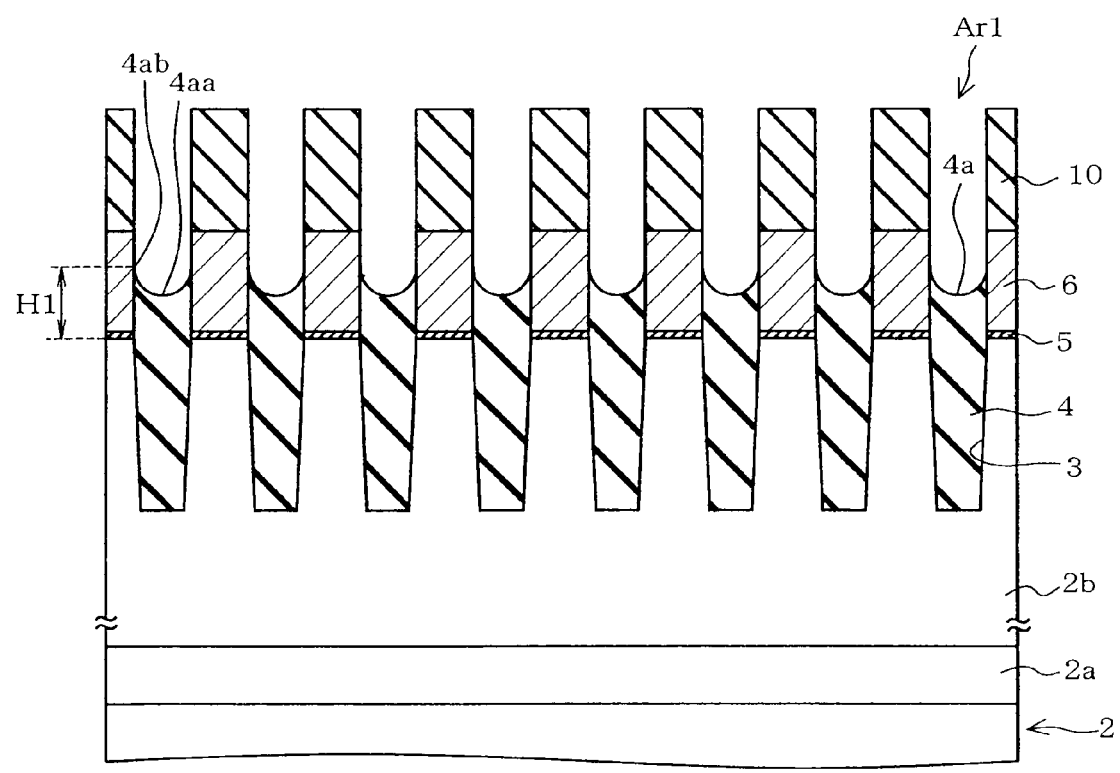
FIGS. 17A and 17B are schematic longitudinal sections taken along line 4A-4A (No. 6) and line 4B-4B (No. 5) in FIG. 3, in a stage of fabrication respectively.
Figure 17B:
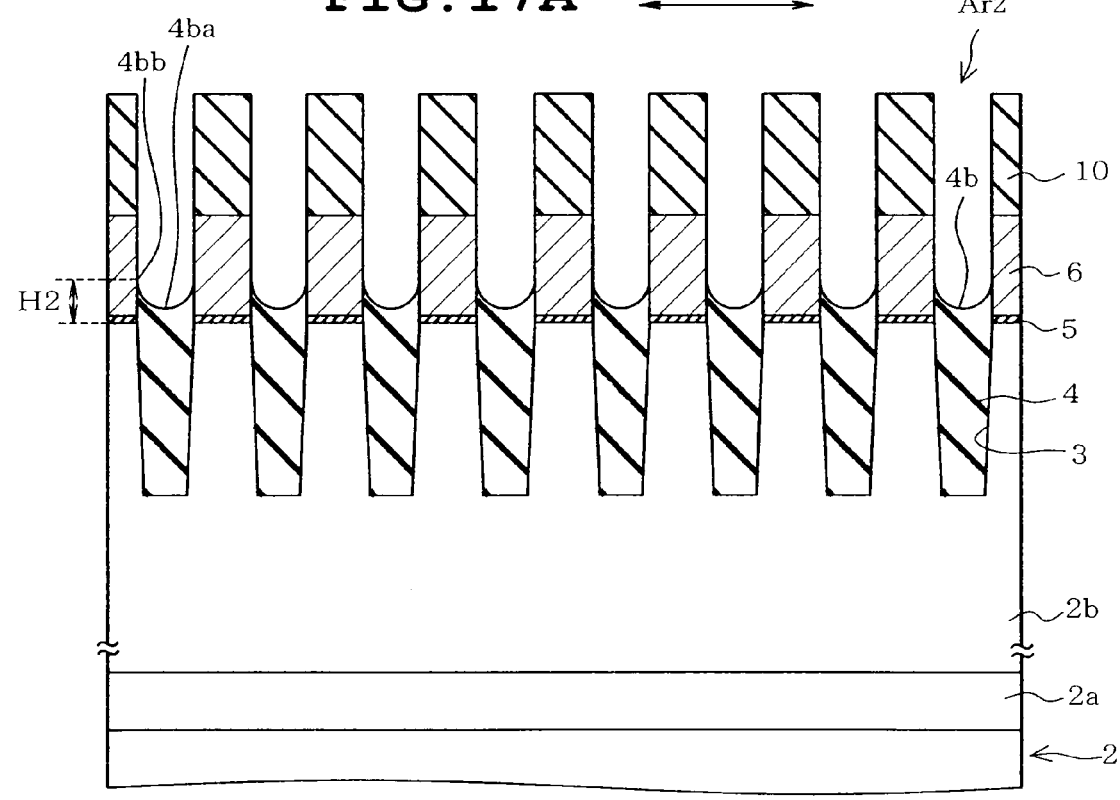

Subsequently, the upper part of the element isolation insulating film 4 of the cell array region Ar2 is further etched by the RIE method, and the mask pattern 13 is then removed, as shown in FIG. 17B. Consequently, the element isolation insulating film 4 of the cell array region Ar2 is formed so that the level of the upper surface 4b thereof is lower than the level of the upper surface 4a of the element isolation insulating film 4 of the cell array region Ar1 as shown in FIG. 17A. In the same manner, the element isolation insulating film 4 of the cell array Ar2 is formed so that the level of the lower end 4ba of the upper surface 4b is lower than a lower end 4aa of the upper surface 4a of the element isolation insulating film 4 in the cell array region Ar1.

Figure 18A:
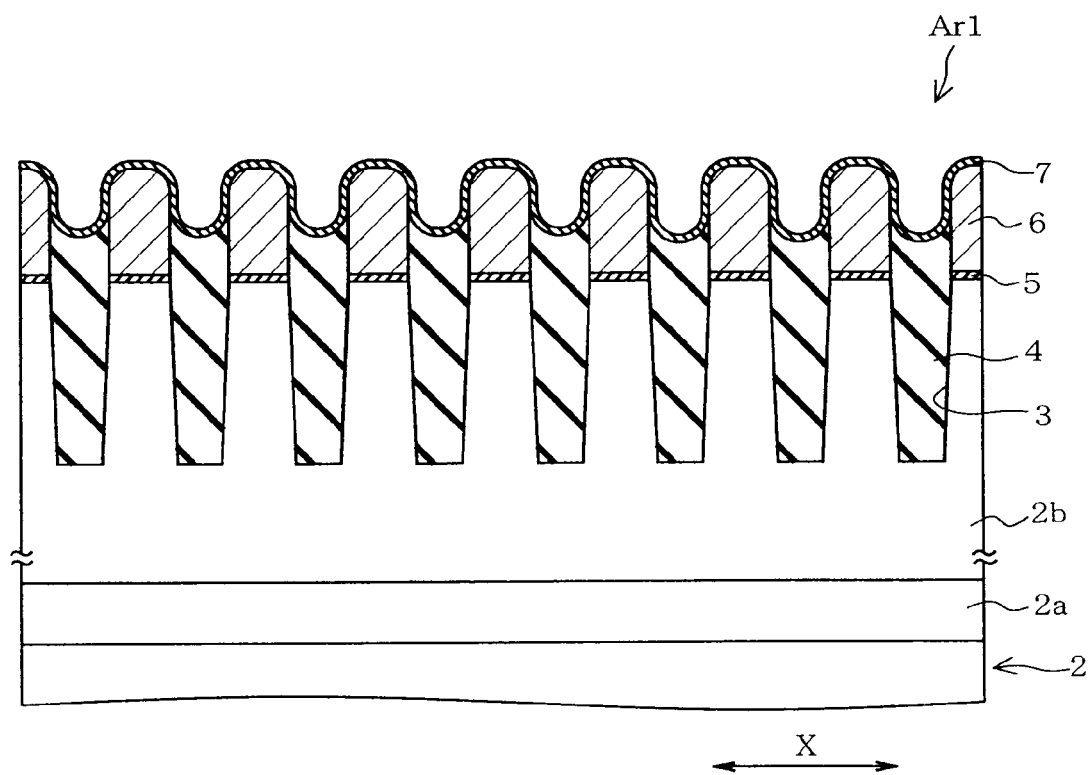
FIGS. 18A and 18B are schematic longitudinal sections taken along line 4A-4A (No. 7) and line 4B-4B (No. 6) in FIG. 3, in a stage of fabrication respectively.
Figure 18B:
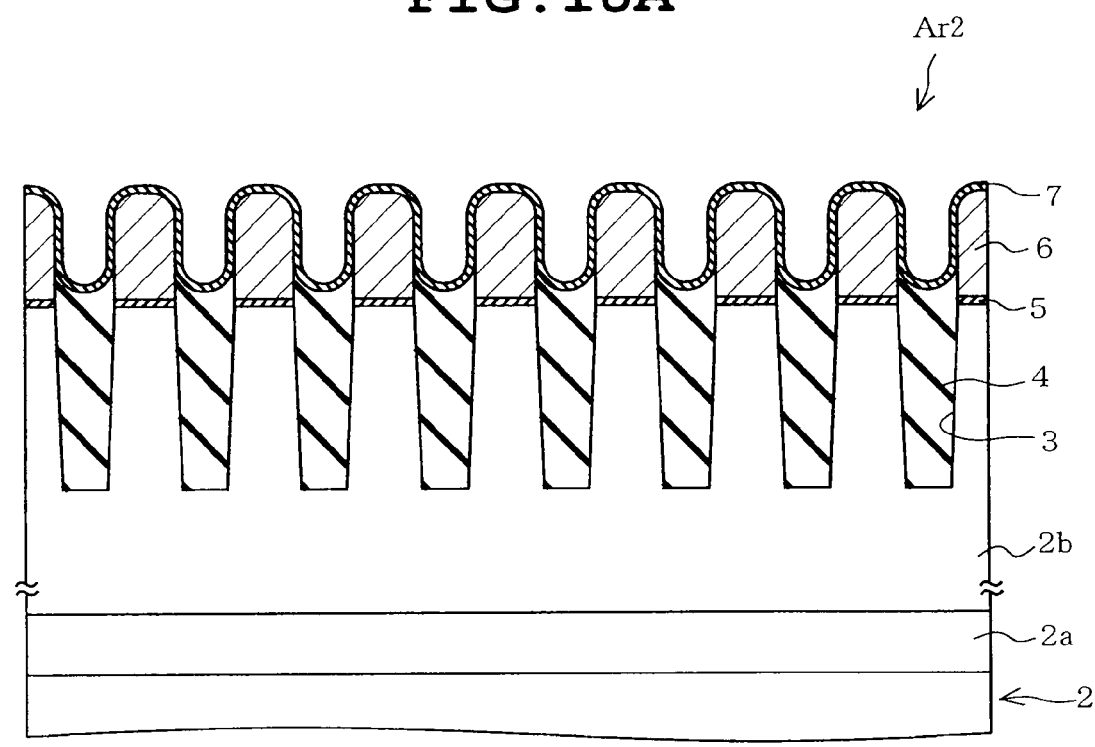

The difference in level between the upper surfaces 4a and 4b of the element isolation insulating film 4 is provided along the boundary Z1 (the portion where source line contacts CS are to be lined up, between adjacent selective gate lines SGLS of the block B). Accordingly, electrical characteristics of the cell unit UC in each of the cell array regions Ar1 and Ar2 can be prevented from being adversely affected. Next, the silicon nitride film 10 is removed by hot phosphoric acid (hot aqueous solution of phosphoric acid), and the intergate insulating film 7 is formed as an ONO film by the LPCVD as shown by FIGS. 18A and 18B.

Figure 19A:
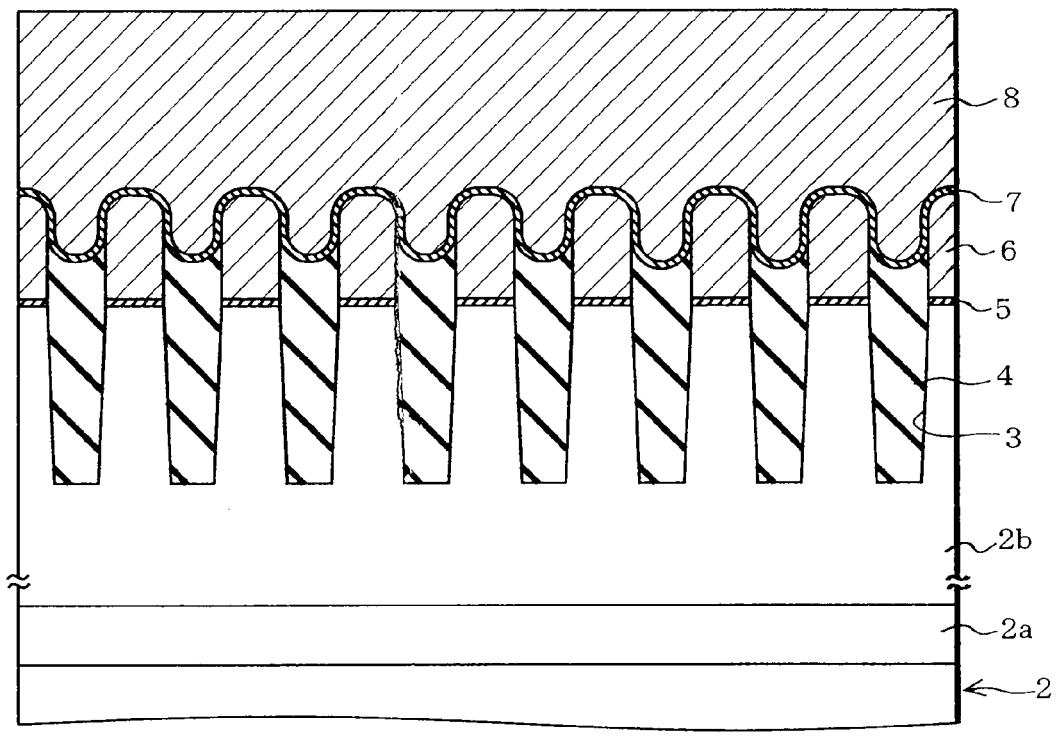
FIGS. 19A and 19B are schematic longitudinal sections taken along line 4A-4A (No. 8) and line 4B-4B (No. 7) in FIG. 3, in a stage of fabrication respectively.
Figure 19B:
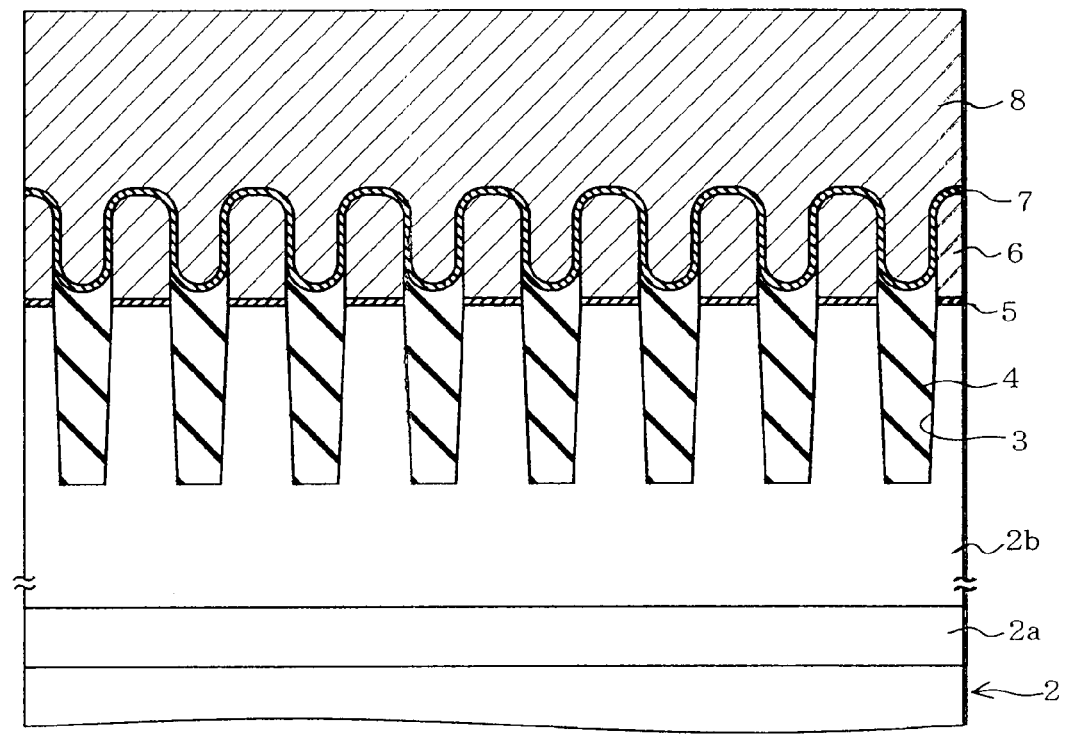

Subsequently, a conductive layer 8 is formed on the intergate insulating film 7 as shown in FIGS. 19A and 19B. In forming the conductive layer 8, the amorphous silicon doped with impurities such as phosphor is deposited in a stepwise manner by the LPCVD method, for example. The silicide layer is formed on an upper part of the conductive layer 8. In a subsequent step, a siliciding metal film is deposited and silicided thereby to be formed into the silicide layer. The siliciding step may be executed before and after deposition of the interlayer insulating film 9 according to a type of metal applied for silicidation.

In the forming of the amorphous silicon, amorphous silicon is firstly deposited on the intergate insulating film 7 so as to have a small film thickness due to the forming of selective gate electrodes SGD and SGS. Short-circuiting openings are formed in the central portions of the intergate insulating film 7 in the selective gate electrodes SGD and SGS. Thereafter, amorphous silicon is deposited so as to fill the openings of the intergate insulating film 7, whereby a base layer of the conductive layer 8 is configured.

Figure 20:
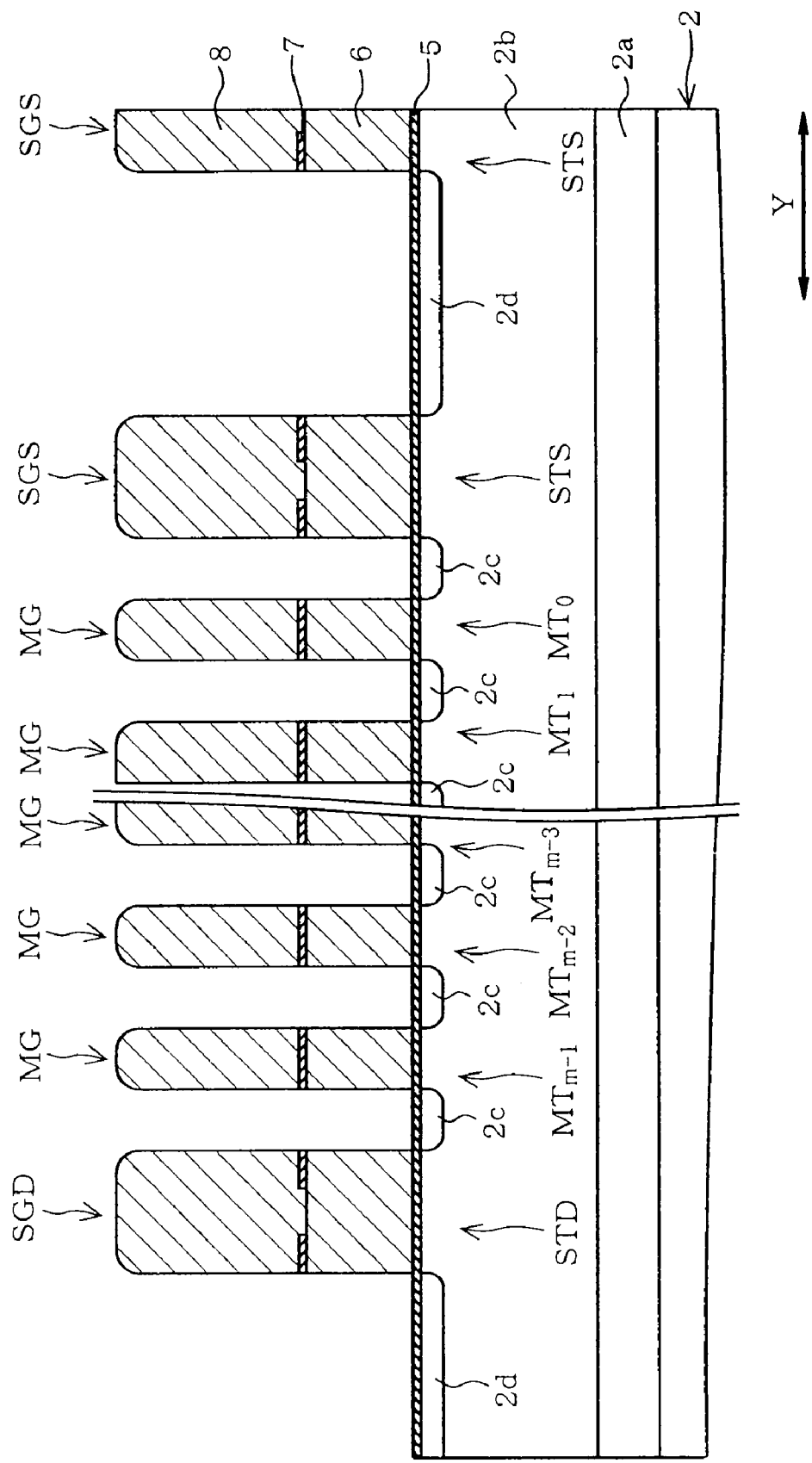
FIG. 20 is a schematic longitudinal section taken along line 5-5 in FIG. 3, in a stage of fabrication.

Subsequently, the polycrystalline silicon layer 6, intergate insulating film 7 and conductive layer 8 are divided into a plurality of parts in the Y direction by the RIE method, whereby the gate electrodes MG, SGD and SGS are formed, as shown in FIG. 20. Subsequently, ions are implanted into the surface layer of the semiconductor substrate 2 located between the gate electrodes MG, SGD and SGS for the purpose of forming impurity diffusion regions 2c and 2d which serve as source/drain regions. The impurity diffusion regions 2d between the gate electrodes SGD and between the gate electrodes SGS are formed by execution of implant of high-density impurities under the condition where spacers are formed in the subsequent process of forming interlayer insulating film 9.

Subsequently, the interlayer insulating film 9 is deposited so as to fill spaces between the gate electrodes MG, SGD and SGS, and contact holes are formed in the interlayer insulating film 9. Thereafter, the structure of the bit line contacts CB and source line contacts CS is formed, and the structure of bit line BL is formed on the bit line contact CB, whereupon the structure as shown in FIG. 5 is obtained. Since a part of the fabricating method subsequent to the forming of the interlayer insulating film 9 is pursuant to ordinary fabricating steps, the description of the part of the fabricating method is eliminated.

According to the foregoing embodiment, the level of the upper surface 4a of the first element isolation insulating film 41 differs from the level of the upper surface 4b of the second element isolation insulating film 42. Accordingly, the characteristics of the memory cell transistors MT in each of the cell array regions Ar1 and Ar2 can be changed. Consequently, the cell array regions Ar1 and Ar2 can be set, in use, so that usages of the cell array regions Ar1 and Zr2 differ from each other. Moreover, the characteristics of the memory cell transistors MT in the cell array regions Ar1 and Ar2 can be rendered suitable for requirements of usage.

The first and second element isolation insulating films 41 and 42 are formed so that the level of the upper surface 4b of the second element isolation insulating film 42 is lower than the level of the upper surface 4a of the first element isolation insulating film 41. This increases a coupling capacitance between the control electrode CG and the floating gate electrode FG of each memory cell transistor MT in the second cell array region Ar2, thereby increasing the coupling ratio. Consequently, the second cell array region Ar2 can be used in the configuration suitable for a multilevel storage region. Furthermore, the memory device of the embodiment has the following characteristics regarding a writing operation. The control circuit CC changes an amount of electric charge of the floating gate electrode FG of each memory cell transistor MT in the block B of the cell array region Ar1 thereby to store binary data of multilevel storage bit number of the cell array region Ar2 on a plurality of blocks B of the cell array region Ar1. Subsequently, the control circuit CC gradually increases an amount of stored charge of the floating gate electrode FG of each memory cell transistor MT in the block B of the cell array region Ar2 on which data is to be written. Consequently, the device is less susceptible to an interferential action between the adjacent memory cells, and false data write and false data read can be prevented as much as possible.

Figure 21A:
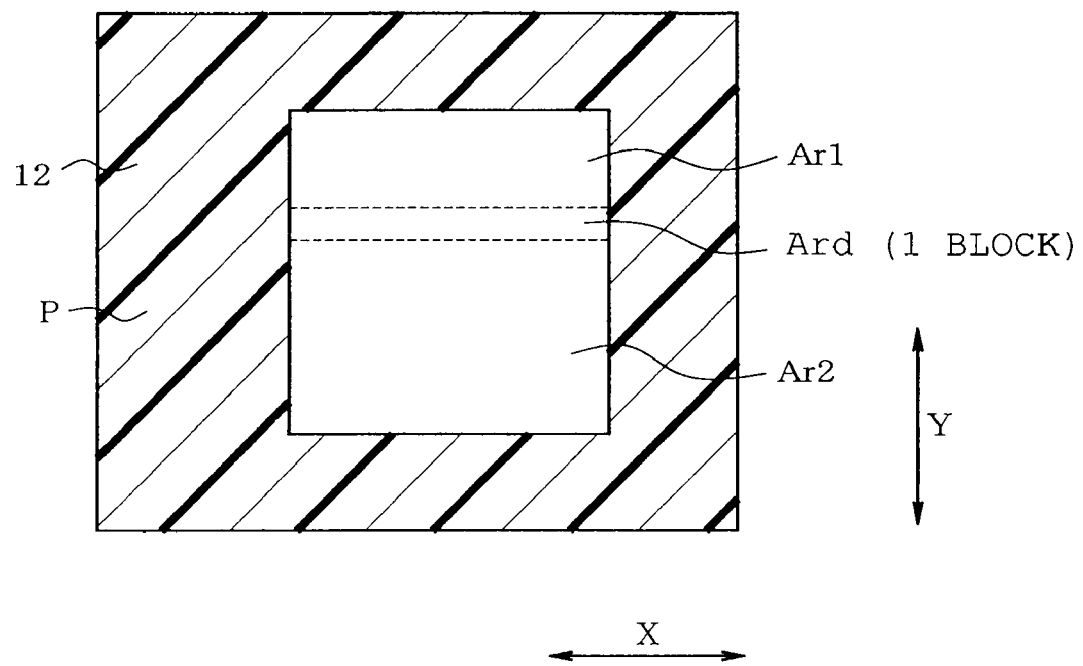
FIGS. 21A and 21B are schematic plan views of a musk-covered region in a stage of fabrication, for explanation of a fumy cell array region in the nonvolatile semiconductor memory device of a second embodiment in accordance with the present invention.
Figure 21B:
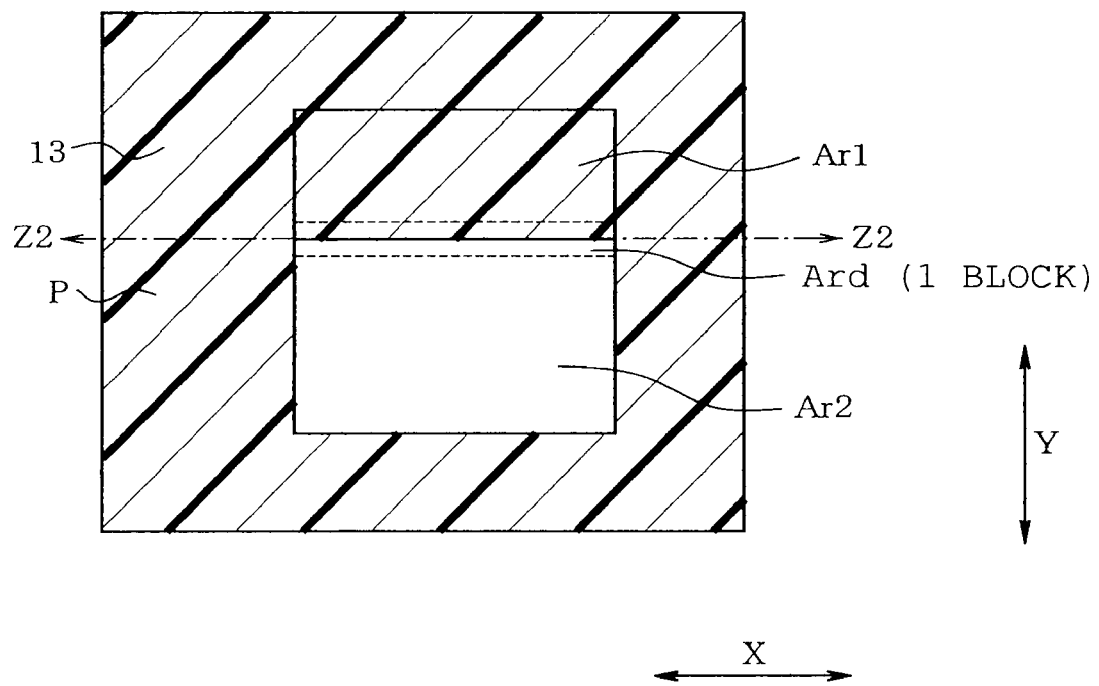

FIGS. 21A and 21B illustrate a second embodiment. The second embodiment differs from the first embodiment in provision of a dummy cell array between the first and second cell arrays. Identical or similar parts in the second embodiment are labeled by the same reference symbols as those in the first embodiment and the description of these parts will be eliminated. Only the difference between the first and second embodiments will be described.

FIGS. 21A and 21B illustrate a dummy cell array region. The dummy cell array Ard is provided between the cell array regions Ar1 and Ar2 as shown in FIG. 21A. The dummy cell array region Ard has an extent of cell unit UC at least not less than one block B. The dummy cell array region Ard is provided with dummy cell transistors each of which has the same structure as the memory cell transistors disposed in the cell array region Ar1 or Ar2 but which are not used as data storage elements. FIGS. 21A and 21B further show regions covered by mask patterns 12 and 13 (hatched regions in FIGS. 21A and 21B), corresponding to FIGS. 14 and 16 referred to in the foregoing embodiment when the levels of the upper surfaces 4a and 4b of the element isolation insulating film 4 are adjusted by the etching process, respectively.

In the second embodiment, the dummy cell array region Ard has a same structure as the cell array regions Ar1 and Ar2 as described above. The element isolation insulating film 4 is formed so as to extend continuously from the cell array region Ar1 through the dummy cell array region Ard to the cell array region Ar2. The levels of the upper surfaces 4a and 4b of the element isolation insulating film are changed in the dummy cell array region Ard.

Describing the fabricating method, the element isolation insulating film 4 is planarized by the CMP method as shown in FIG. 13 and thereafter, the mask pattern 12 (the same as shown in FIG. 14) as shown in FIG. 21A is formed. The mask pattern covers a region which includes the peripheral circuit region P and excludes the cell array regions Ar1 and Ar2 and the dummy cell array region Ard. Subsequently, the element isolation insulating film 4 is etched by the RIE method so that the locations of upper surfaces 4a and 4b and the like in the regions Ar1 and Ar2 are adjusted, as shown in FIG. 15. The mask pattern 12 is then removed.

Subsequently, the mask pattern 13 having an opening corresponding to the cell array region Ar2 is formed as shown in FIG. 21B. The mask pattern 13 has a y-direction boundary Z2 provided in the dummy cell array region Ard. The boundary Z2 extends along the direction (X direction) in which a plurality of cell units UC in one block B of the dummy cell array region Ard are aligned. Subsequently, the element isolation insulating film 4 in the cell array region Ar2 is anisotropically-etched by the RIE method with the mask pattern 13 serving as a mask, whereby a difference in level is caused between the upper surfaces 4a and 4b of the element isolation insulating film 4 in the dummy cell array region Ard which is a region including the boundary Z2 of the mask pattern 13.

The following advantages can be achieved from employment of the above-described fabricating method. Recent refinement in the microstructure of semiconductor devices and reduction in the design rules tends to result in adverse effect of alignment deviation of resist patterning. However, even if y-direction alignment deviation of the mask pattern 13 occurs, the boundary Z2 is provided in the dummy cell array region Ard which is not actually operable. Accordingly, the blocks B in the cell array regions Ar1 and Ar2 are not adversely affected by the alignment deviation of the patterning. Consequently, the cell unit UC in each cell array region can be normally operated, which can improve the device reliability.

The foregoing embodiments should not be restrictive but may be modified or expanded as follows. Although each embodiment is directed to the NAND flash memory device, a NOR nonvolatile semiconductor memory device may be described, instead. Moreover, a nonvolatile semiconductor memory device provided with further another memory storable in the nonvolatile manner.

In the foregoing embodiment, the cell array regions Ar1 and Ar2 are divided in the unit of block B of the NAND cell unit UC, and the boundary Z1 of the element isolation insulating films 4a and 4b is provided between the adjacent blocks B. However, the boundary Z1 may or may not be provided between the adjacent blocks B. Furthermore, the boundary Z1 is located in the alignment section of the source line contacts CS so as to extend along the aligned source line contacts CS in the foregoing embodiment. However, the boundary Z1 may be located in an alignment section of the bit line contacts CB so as to extend along the aligned bit line contacts CB, instead.

Although the memorial cell array Ar is divided into two cell array regions Ar1 and Ar2 in the foregoing embodiments, the memorial cell array Ar may be divided into three or more cell array regions, instead. The write/erase cycle may or may not be different for every one of a plurality of cell array regions.

The first cell array region Ar1 serves as a binary storage area and the second cell array region Ar2 serves as a multilevel storage area in the foregoing embodiments. However, the first cell array region Ar1 may serve as a multilevel storage area which stores n bits of not less than 2 bits per memory cell transistor MT, and the second cell array region Ar2 may swerve as a multilevel storage area which stores bit numbers exceeding n bits per memory cell transistor MT, instead.

The dummy cell array Ard may be provided as the occasion arises. The silicon nitride film 10 may also be formed as the occasion arises. Although the intergate insulating film 7 is constituted by the ONO film in the foregoing embodiments, the intergate insulating film 7 may be constituted by a NONON film formed as the result of radical nitriding executed before or after the forming of the ONO film or a NOAON film formed by interposing alumina ($Al_2O_3$) between the stacked structure of oxide and nitride films.

The first and second trenches 31 and 32 may be continuous or separated. The first and second element isolation insulating films 41 and 42 may be continuous or separated. The first and second gate insulating films 51 and 52 may be continuous or separated. The first and second interelectrode insulating films 71 and 72 may be continuous or separated.

Although the structure of interlayer insulating film 9 is stacked on the gate electrodes MG, SGD and SGS in the foregoing embodiments, a barrier film such as a silicon nitride film and various types of material films for a stopper of CMP process may be formed in a region where the interlayer insulating film 9 is formed, instead. In this case, the barrier film blocks waste from passing from the upper layer side of the gate electrode MG to the active area AA, for example.

In the fabricating process, the locations of the upper surfaces 4A and 4b may be adjusted by forming a mask pattern on the region other than region to be processed with respect to the upper portion of the element isolation insulating film 4 in each of the cell array regions Ar1 and Ar2 and collectively etching each of the cell array regions Ar1 and Ar2. The same can be applied to a case where the dummy cell array Ard is provided. The sequence and timing of the etching process should not be limited by those described in the foregoing embodiments.

The above-described embodiments each include various modified forms. The problem described in the Related Art can be overcome even if one or more of all the components of the device are eliminated.

The foregoing description and drawings are merely illustrative of the principles and are not to be construed in a limiting sense. Various changes and modifications will become apparent to those of ordinary skill in the art. All such changes and modifications are seen to fall within the scope as defined by the appended claims.

What is claimed is:

1. A nonvolatile semiconductor memory device comprising:
   a semiconductor substrate having a first cell array region in which a first memory cell transistor is disposed and a second cell array region in which a second memory cell transistor is disposed;
   a plurality of first element isolation insulating films formed on a surface of the semiconductor substrate corresponding to the first cell array region into a band shape;
   a plurality of second element isolation insulating films formed on a surface of the semiconductor substrate corresponding to the second cell array region into a band shape;
   a first gate electrode for the first memory cell transistor formed by dividing the semiconductor substrate corresponding to the first cell array region by the first element isolation insulating film, the first gate electrode having a first gate insulating film formed on a first active region divided by the first element isolation insulating film, a first charge storage layer formed on the first gate insulation film, a first interelectrode insulating film formed on the first charge storage layer and a first control electrode formed on the first interelectrode insulating film; and
   a second gate electrode for the second memory cell transistor formed by dividing the semiconductor substrate corresponding to the second cell array region by the second element isolation insulating film, the second gate electrode having a second gate insulating film formed on a second active region divided by the second element isolation insulating film, a second charge storage layer formed on the second gate insulation film, a second interelectrode insulating film formed on the second charge storage layer and a second control electrode formed on the second interelectrode insulating film, wherein each first element isolation insulating film has a height from a surface of the semiconductor substrate, the first charge storage layer has a height from the surface of the semiconductor substrate, and each second element isolation insulating film has a height from the surface of the semiconductor substrate, the height of each first element isolation insulating film being lower than the height of the first charge storage layer and higher than the height of each second element isolation insulating film.

2. The nonvolatile semiconductor memory device according to claim 1, wherein the first and second cell array regions are adjacent to each other, and each first element isolation insulating film is disposed so as to be in alignment with one of the second element isolation insulating films.

3. The nonvolatile semiconductor memory device according to claim 2, further comprising a dummy cell array region provided between the first and second cell array regions, the dummy cell array region being formed with a dummy cell that is not used as a memory element, wherein the dummy cell array region is provided with a boundary region between the first and second element isolation insulating films.

4. The nonvolatile semiconductor memory device according to claim 1, wherein the first cell array region is configured into a binary storage area memorizing a 1-bit, and the second cell array region is configured into a multiple-valued storage area memorizing a 2-bit or higher.

5. The nonvolatile semiconductor memory device according to claim 1, wherein the first cell array region is configured into a temporary storage area, and the second cell array region is configured into a long-term storage area.

6. The nonvolatile semiconductor memory device according to claim 1, wherein the second memory cell transistor is configured so as to have a larger coupling ratio than the first memory cell transistor.

7. The nonvolatile semiconductor memory device according to claim 1, wherein each of the first and second interelectrode insulating films is an oxide-nitride-oxide (ONO) film.

8. The nonvolatile semiconductor memory device according to claim 1, wherein each of the first and second memory cell transistors is configured as a memory cell transistor of a NAND flash memory.

9. The nonvolatile semiconductor memory device according to claim 1, wherein each of the first and second memory cell transistors is configured as a memory cell transistor of a NOR-type flash memory.

10. A process of writing data on a nonvolatile semiconductor memory device, the nonvolatile semiconductor memory device including:
    a first cell array region in which a first memory cell transistor is disposed on a semiconductor substrate and a second cell array region in which a second memory cell transistor is disposed on the semiconductor substrate;
    a plurality of first element isolation insulating films formed in a surface of the semiconductor substrate in the first cell array region, so as each to have a band shape;
    a plurality of second element isolation insulating films formed in a surface of the semiconductor substrate in the second cell array region, so as each to have a band shape;
    a first gate electrode of the first memory cell transistor divided by the first element isolation insulating film on the semiconductor substrate in the first cell array region, the first gate electrode having a first gate insulating film formed on a first active region divided by the first element isolation insulating film, a first charge storage layer formed on the first gate insulating film, a first interelectrode insulating film formed on the first charge storage layer and a first control electrode formed in the first interelectrode insulating film;
    a second gate electrode of the second memory cell transistor divided by the second element isolation insulating film on the semiconductor substrate in the second cell array region, the second gate electrode having a second gate insulating film formed on a second active region divided by the second element isolation insulating film, a second charge storage layer formed on the second gate insulating film, a second charge storage layer formed on the second gate insulating film, a second interelectrode insulating film formed on the second charge storage layer and a second control electrode formed in the second interelectrode insulating film, the nonvolatile semiconductor memory device, wherein:

each first element isolation insulating film has a height from a surface of the semiconductor substrate, the first charge storage layer has a height from the surface of the semiconductor substrate, and each second element isolation insulating film has a height from the surface of the semiconductor substrate, the height of each first element isolation insulating film being lower than the height of the first charge storage layer and higher than the height of each second element isolation insulating film; and the first cell array region is configured into a temporary storage area, and the second cell array region is configured into a long-term storage area, the nonvolatile semiconductor memory device further including a control section executing a process of writing data onto the first and second memory cell transistors, wherein the control section further executes a process of writing data for every bit of multilevel data to be written onto different first memory cell transistors of the first memory cell region, a process of reading the multilevel data for every bit from the first memory cell transistor of the first memory cell region and writing the read data for every bit onto the same second memory cell transistor of the second memory cell region with respect to every bit.

* * * * *